US008204146B2

(12) United States Patent
Mimura et al.

(10) Patent No.: US 8,204,146 B2
(45) Date of Patent: Jun. 19, 2012

(54) IMPULSE WAVEFORM GENERATING APPARATUS AND RADIO-FREQUENCY PULSE WAVEFORM GENERATING APPARATUS

(75) Inventors: Masahiro Mimura, Tokyo (JP); Kazuaki Takahashi, Tokyo (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 1297 days.

(21) Appl. No.: 11/909,910

(22) PCT Filed: Mar. 29, 2006

(86) PCT No.: PCT/JP2006/306441
§ 371 (c)(1),
(2), (4) Date: Sep. 27, 2007

(87) PCT Pub. No.: WO2006/106718
PCT Pub. Date: Oct. 12, 2006

(65) Prior Publication Data
US 2009/0135974 A1 May 28, 2009

(30) Foreign Application Priority Data

Mar. 31, 2005 (JP) ................. 2005-102204
Mar. 6, 2006 (JP) ................. 2006-059152

(51) Int. Cl.
*H04L 7/00* (2006.01)
(52) U.S. Cl. ...................... 375/295; 375/354
(58) Field of Classification Search .............. 375/295, 375/354; 455/318, 255, 76, 260, 265; 331/18; 324/642; 332/106
See application file for complete search history.

(56) References Cited

U.S. PATENT DOCUMENTS

| 6,026,125 | A | 2/2000 | Larrick et al. | |
| 6,700,939 | B1 | 3/2004 | McCorkle et al. | |
| 2001/0036817 | A1* | 11/2001 | Yamada et al. | 455/260 |
| 2002/0090036 | A1* | 7/2002 | Matsusaka | 375/296 |
| 2003/0161411 | A1* | 8/2003 | McCorkle et al. | 375/295 |
| 2004/0131130 | A1* | 7/2004 | Shor et al. | 375/308 |
| 2004/0136438 | A1* | 7/2004 | Fullerton et al. | 375/130 |
| 2007/0087715 | A1* | 4/2007 | Mimura et al. | 455/255 |

FOREIGN PATENT DOCUMENTS

| JP | 2003-032225 | 1/2003 |
| JP | 2003-535552 A | 11/2003 |
| WO | WO 2004/036810 A2 | 4/2004 |

OTHER PUBLICATIONS

H. Kim et al., "All-digital low-power CMOS pulse generator for UWB system", Electronics Letters, Nov. 25, 2004, pp. 1534-1535, vol. 40, Issue 24, Tempe, Arizona, USA.
International Search Report for Publication No. PCT/JP2006/306441 dated Apr. 25, 2006.

* cited by examiner

*Primary Examiner* — Aristocratis Fotakis
(74) *Attorney, Agent, or Firm* — RatnerPrestia

(57) ABSTRACT

An impulse waveform generating apparatus includes a multistage delay pulse signal generating part for generating a plurality of delay pulse signals by a timing signal; a signal source signal generating part for generating a signal source signal indicating the frequency component of an impulse waveform signal by the delay pulse signals; an envelope formation signal generating part for generating an envelope formation signal indicating the amplitude component of the impulse waveform signal by the delay pulse signals; and a mixer part for multiplying the signal source signal by the envelope formation signal to generate a prescribed impulse waveform signal. The impulse waveform generating apparatus generates the impulse waveform signal from the timing signal. Therefore, the circuit arrangement requires no digital-to-analog converter, the operational frequency of each element can be reduced, and the power consumption can be reduced.

16 Claims, 26 Drawing Sheets

|  | First crest value | Second crest value | Third crest value | Fourth crest value | Fifth crest value |
|---|---|---|---|---|---|
| True value | 1.000 | -0.214 | 0.129 | -0.091 | 0.071 |
| Instance | 1.000 | -0.214 | 0.129 | -0.301 |  |

|  | First crest value | Second crest value | Third crest value | Fourth crest value | Fifth crest value |
|---|---|---|---|---|---|
| True value | 1.000 | -0.214 | 0.129 | -0.091 | 0.071 |
| Instance | 1.000 | -0.214 | 0.129 | -0.091 | |

|  | First crest value | Second crest value | Third crest value | Fourth crest value | Fifth crest value |
|---|---|---|---|---|---|
| True value | 1.000 | -0.214 | 0.129 | -0.091 | 0.071 |
| Instance | 1.000 | -0.214 | 0.129 | -0.091 |  |

| | First crest value | Second crest value | Third crest value | Fourth crest value | Fifth crest value |
|---|---|---|---|---|---|
| True value | 1.000 | -0.214 | 0.129 | -0.091 | 0.071 |
| Instance | 1.000 | -0.214 | 0.129 | | |

|  | First crest value | Second crest value | Third crest value | Fourth crest value | Fifth crest value |
|---|---|---|---|---|---|
| True value | 1.000 | -0.214 | 0.129 | -0.091 | 0.071 |
| Instance | 1.000 | -0.214 | 0.129 | -0.091 | |

561　562　563　564

US 8,204,146 B2

IMPULSE WAVEFORM GENERATING APPARATUS AND RADIO-FREQUENCY PULSE WAVEFORM GENERATING APPARATUS

This application is a U.S. National Phase application of PCT International Application PCT/JP2006/306441.

TECHNICAL FIELD

The present invention relates to an impulse waveform generating apparatus that generates pulsed modulation signals, and a radio-frequency pulse waveform generating apparatus.

BACKGROUND ART

Ultra-wideband (UWB) wireless communication technology using the impulse communication scheme does not necessarily require linearity. For this reason, this technology is suitable for making telecommunication equipment based on complementary metal oxide semiconductors (CMOSs), and reducing the size thereof. Additionally, requiring no radio-frequency (RF) circuits, such as highly precise local signal sources, this technology has advantages of lower power consumption and high-speed communication using a broadband.

An impulse waveform generating apparatus for use in UWB wireless telecommunication equipment requires generation of the envelope of an impulse waveform at high precision to control the frequency band to be used. In general, impulse waveform F(t) having band center frequency F0 and bandwidth W in given band frequencies is defined by the [Equation (Eq.)1].

$$F(t) = \frac{\sin(2\pi Wt)}{\pi t} \cos(2\pi F0 t) \quad [\text{Eq. 1}]$$

In a known method of generating impulse waveforms, a structure including a digital-to-analog (D/A) converter is used. FIG. 25 is a block diagram of a conventional impulse waveform generating apparatus using a D/A converter. With reference to FIG. 25, conventional impulse waveform generating apparatus 1100 has rectangular-wave oscillator 1111 for generating rectangular waves, storage 1113 for storing voltages corresponding to a waveform table, and D/A converter 1112 for generating an impulse waveform from the supplied rectangular waves according to external voltage.

In conventional impulse waveform generating apparatus 1100, D/A converter 1112 generates a voltage corresponding to the waveform table stored in storage 1113, at the timing of rectangular waves output from rectangular-wave oscillator 1111, and generates impulse waveform F(t) 1114.

This conventional impulse waveform generating apparatus 1100 is capable of generating uniform waveforms at high precision. Additionally, circuit control is easy, and no impulse shaping filter is necessary. Thus, this apparatus is suitable for circuit integration. On the other hand, this apparatus requires sampling rates several times the band frequencies of the impulse waveforms generated in D/A converter 112. For example, generation of an impulse waveform in the band ranging from 3 GHz to 10 GHz inclusive requires a sampling rate of several tens of gigahertz. In general, to structure an impulse waveform generating apparatus using a D/A converter operating at such radio-frequencies, elements having high switching frequencies are used. This structure requires high power consumption.

Japanese Translation of PCT Publication No. 2003-535552 discloses an impulse waveform generating apparatus for generating waveforms approximating the Gaussian primary derived function, using a digital circuit instead of a D/A converter.

FIG. 26 is a block diagram of the conventional impulse waveform generating apparatus using this digital circuit. FIG. 27 is a timing diagram of this conventional impulse waveform generating apparatus.

With reference to FIG. 26, conventional impulse waveform generating apparatus 1300 includes the following elements: clock 1301 for generating clock pulses; buffer 1304; inverting buffer 1306; delay element 1324 having a delay effect, i.e. delay time length "L"; delay element 1308 having a delay effect of "L+X"; AND gate 1316; buffer 1320; inverting buffer 1322; delay element 1310 having delay time length L; delay element 1325 having delay time length L+X; buffers 1332, 1334, 1336, and 1337; adding circuits 1348 and 1350; and switch 1356.

Clock 1301 feeds clock pulses into buffer 1304 and inverting buffer 1306. Buffers 1304 and 1306 feed clock pulses into AND gate 1316 via delay elements 1310 and 1308, respectively. Delay element 1308 has a longer delay effect (X) than delay element 1310. AND gate 1316 outputs AND signal C of supplied signal 1312 (A) and signal 1314 (B). The output from AND gate 1316 is fed into buffer 1320 and inverting buffer 1322 via line 1318, and further passed to delay elements 1324 and 1325 having the same delay effects as delay elements 1310 and 1308, respectively. The output from each of delay elements 1324 and 1325 is divided and fed into buffers 1332, 1334, 1336, and 1337. Then, buffers 1332 and 1334 feed the output without any change into adding circuit 1348 via lines 1340 and 1342, respectively. Buffers 1336 and 1337 feed the inverted output to adding circuit 1350 via lines 1129 and 1346, respectively.

Respective lines 1340, 1342, 1129, and 1346 supply different components that are halves in a positive or negative direction of an individual pulse, such as pulse 1360 shown in FIG. 27. The output from adding circuits 1348 and 1350 are fed into switch 1356 via lines 1352 and 1354, respectively. Control circuit 1358 switches adding circuits 1348 and 1350 so that a bi-phase waveform having prescribed phase "0" is supplied when switch 1356 is at a first setting and the opposite bi-phase waveform is supplied when the switch is in opposite state "1".

In this manner, in conventional impulse waveform generating apparatus 1300 using a digital circuit, pulse signals are generated from two clock signals having a slight difference in delay effect time length. Then, from the generated pulse signals and inverted pulse signals, pulse signals having a slight difference in delay effect time are generated. Thus, a necessary impulse waveform is generated by the supplied bi-phase waveforms.

Above conventional impulse waveform generating apparatus 1100 using a D/A converter operates at a high operational frequency, and thus has high power consumption.

Above conventional impulse waveform generating apparatus 1300 using a digital circuit generates a waveform only by superimposing impulses. Thus, the waveform cannot be generated at high precision. Further, conventional impulse waveform generating apparatus 1300 has a wide frequency range of generated impulses and requires an impulse shaping filter in the later stage. Thus, the entire circuits cannot be made into integrated circuits.

SUMMARY OF THE INVENTION

An impulse waveform generating apparatus of the present invention includes the following elements: a multistage delay pulse signal generating part for generating a plurality of delay pulse signals having different delay times from a timing signal; a signal source signal generating part for generating a signal source signal indicating the frequency component of an impulse waveform signal by the delay pulse signals; an envelope formation signal formation part for generating an envelope formation signal indicating the amplitude component of the impulse waveform signal by the delay pulse signals; and a mixer part for multiplying the signal source signal by the envelope formation signal to generate the prescribed impulse waveform signal. Thus, the impulse waveform generating apparatus generates the impulse waveform signal, from the timing signal indicating the timing at which the impulses are to be generated.

The impulse waveform generating apparatus generates a signal to be an impulse signal source, using the multistage delay elements instead of an oscillator. Further, the signal is multiplied by the envelope formation signal to provide an impulse waveform. Therefore, in the impulse waveform generating apparatus of the present invention, the circuit arrangement requires no digital-to-analog converter, so that the operational frequency of each element can be made lower than those originally required and the power consumption can be reduced. Further, the impulse waveform generating apparatus of the present invention generates a band-limited impulse waveform at high precision, and thereby reduces the power radiation in the frequency domain other than the communication band and improves power efficiency in communication. The impulse waveform generating apparatus of the present invention does not require a higher-order radio-frequency filter, i.e. an impulse shaping filter. Thus, circuit integration can reduce the size of the telecommunication equipment and power consumption at the same time.

BRIEF DESCRIPTION OF THE DRAWINGS

FIG. 12 is a table showing crest values of an output signal from the impulse waveform generating apparatus in accordance with the second exemplary embodiment.

FIG. 15 is a table showing crest values of an output signal from the impulse waveform generating apparatus in accordance with the third exemplary embodiment.

FIG. 18 is a table showing crest values of an output signal from the impulse waveform generating apparatus in accordance with the fourth exemplary embodiment.

FIG. 21 is a table showing crest values of an output signal from the impulse waveform generating apparatus in accordance with the fifth exemplary embodiment.

Figure 1:
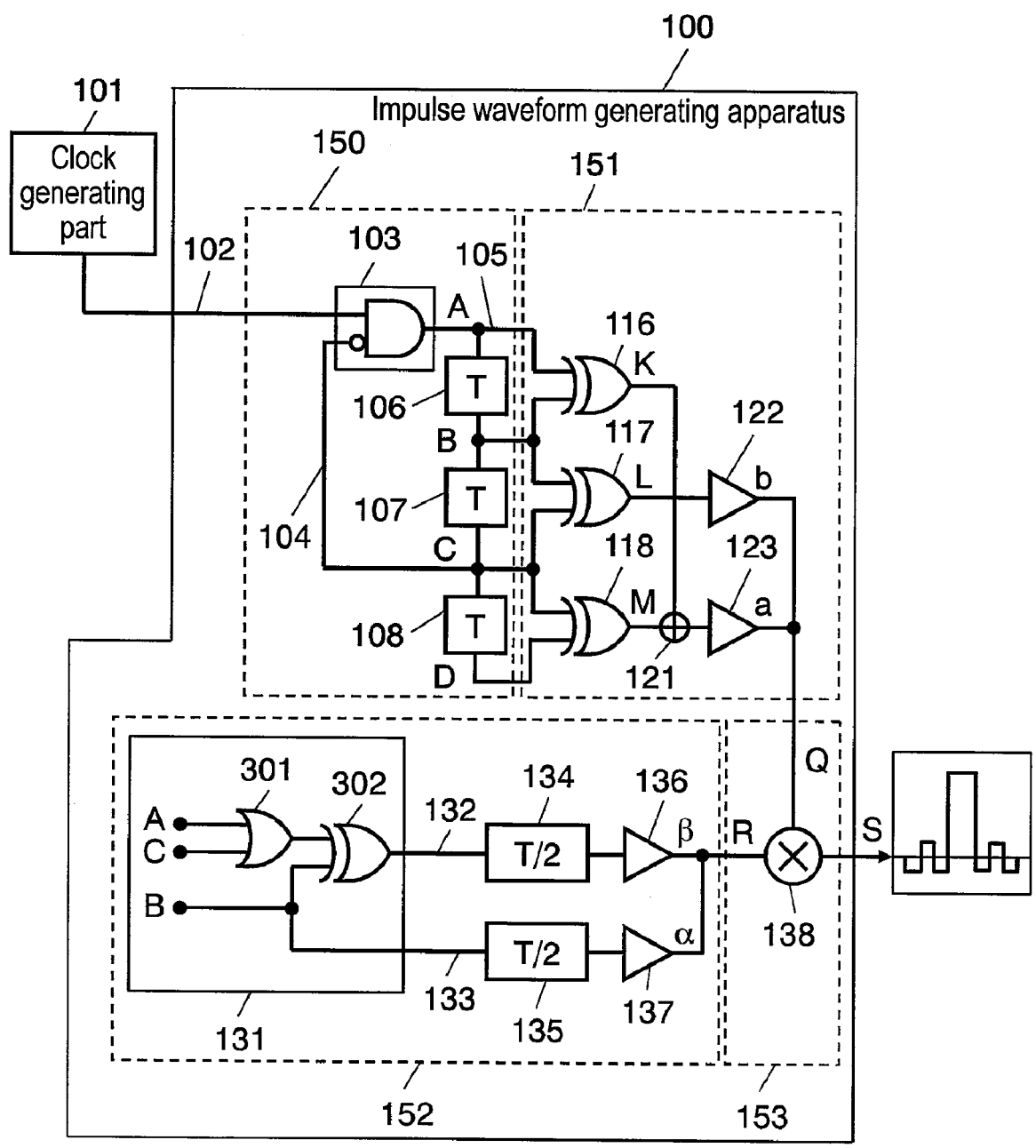
FIG. 1 is a block diagram of an impulse waveform generating apparatus in accordance with a first exemplary embodiment of the present invention.

REFERENCE MARKS IN THE DRAWINGS 100, 200, 300, 400, 500, 600, 900 Impulse waveform generating apparatus
101 Clock generating part
102 Timing signal
103 Signal controller
104 Control signal
105 Reference time signal
106, 107, 108, 109, 110, 134, 135, 710, 711, 712, 713, 714, 701, 702, 703, 704, 705, 706 Delay element
116, 117, 118, 302, 304, 801, 802, 803, 804, 805 XOR element
121 Voltage adding element
122, 123, 136, 137, 506, 507, 508 Amplifier
131, 131b, 131c, 131d Waveform generator
132 First control signal
133 Second control signal
138 Mixer
150, 250, 350, 450, 550, 650 Multistage delay pulse signal generating part
151, 251, 351, 451, 551, 651 Signal source signal generating part
152, 252, 352, 452, 552, 652 Envelope formation signal generating part
153, 253, 353, 453, 553, 653 Mixer part
501, 502, 503, 504, 505 AND element
601, 602, 603, 604, 605 Inverting element
901 Circuit part
902 Synthesizing signal generator
903 Additional mixer part
904 Impulse waveform signal
905 Synthesizing signal
906 Other impulse waveform signal
910, 920 Radio-frequency (RF) pulse waveform generating apparatus
911, 921 RF pulse waveform signal generating part
912 RF pulse waveform signal
923 Transmit data signal
925 Waveform-modulated RF pulse waveform signal
Q Signal source signal
R Envelope formation signal
S Impulse waveform signal

DETAILED DESCRIPTION OF PREFERRED EMBODIMENTS

First Exemplary Embodiment

An impulse waveform generating apparatus of the first exemplary embodiment of the present invention generates a signal to be an impulse signal source using multistage delay elements and multiplies the impulse signal source signal by an envelope formation signal, thereby generating an impulse waveform. This impulse waveform generating apparatus generates impulse waveforms in the occupied band defined by center frequency F0 and bandwidth W. A specific description is provided of a case where an impulse waveform having center frequency F0 and bandwidth W equal to those of an ideal impulse waveform is generated. At this time, time length T is a half cycle with respect to center frequency F0, i.e. $T=\frac{1}{2}(2 \cdot F0)$.

A description is provided of a structure of an impulse waveform generating apparatus of this exemplary embodiment.

FIG. 1 is a block diagram of an impulse waveform generating apparatus in accordance with the first exemplary embodiment of the present invention. With reference to FIG. 1, impulse waveform generating apparatus 100 is coupled to clock generating part 101 for generating timing signal 102 indicating a timing at which an impulse waveform is to be generated. The impulse waveform generating apparatus includes the following elements: multistage delay pulse signal generating part 150 for generating a plurality of delay pulse signals having different delay times by timing signal 102; signal source signal generating part 151 for generating a signal source signal indicating the frequency component of the impulse waveform signal by the delay pulse signals; envelope formation signal generating part 152 for generating an envelope formation signal indicating the amplitude component of the impulse waveform signal by the delay pulse signals; and mixer part 153 for multiplying the signal source signal by the envelope formation signal to generate the prescribed impulse waveform signal.

Further, multistage delay pulse signal generating part 150 includes signal controller 103, and delay elements 106, 107, and 108 constituting a multistage delay circuit as a multistage delay part. Signal source signal generating part 151 includes XOR elements 116, 117, and 118, voltage adding element 121, and amplifiers 122 and 123. Envelope formation signal generating part 152 includes waveform generator 131, delay elements 134 and 135 as adjusting-delay elements, and amplifiers 136 and 137. Mixer part 153 includes mixer 138.

Upon receipt of timing signal 102 and control signal 104, signal controller 103 outputs timing signal 102 as reference time signal 105 only when control signal 104 is in a H state (i.e. at a high level value). When control signal 104 is in a L state (i.e. at a low level value), the signal controller stops the output.

Figure 2A:
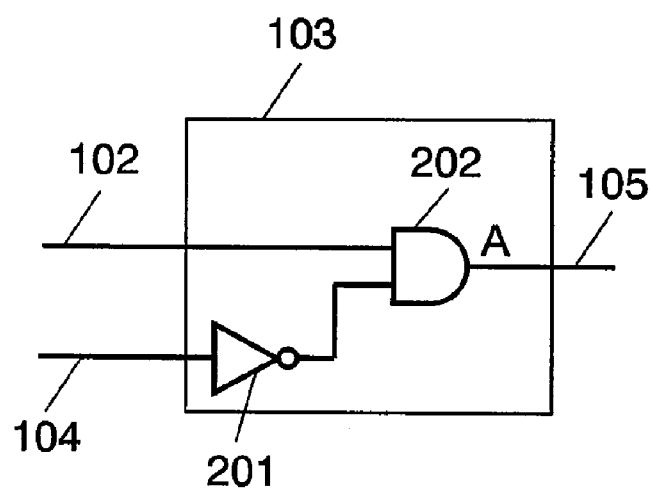
FIG. 2A is a block diagram illustrating an example of a structure of a signal controller of the impulse waveform generating apparatus in accordance with the first exemplary embodiment.
Figure 2B:
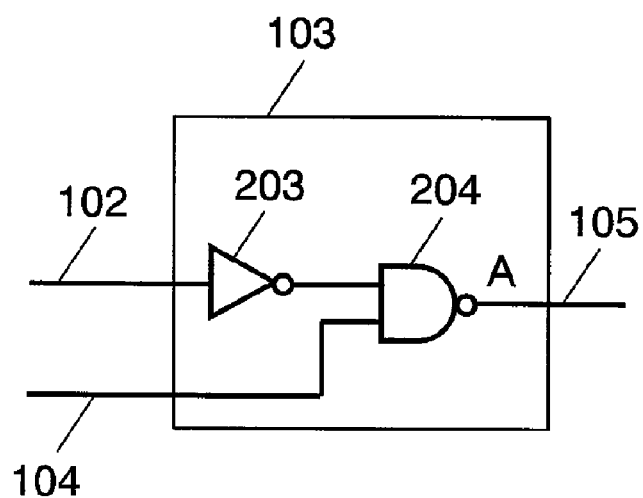
FIG. 2B is a block diagram illustrating another example of the structure of the signal controller of the impulse waveform generating apparatus in accordance with the first exemplary embodiment.

FIG. 2A is a block diagram illustrating an example of a structure of the signal controller in accordance with the first exemplary embodiment of the present invention. In FIG. 2A, signal controller 103 includes inverting circuit 201 and AND circuit 202. Signal controller 103 can also be implemented by another circuit arrangement. FIG. 2B is a block diagram illustrating another example of the structure of the signal controller in accordance with the first exemplary embodiment. In FIG. 2B, signal controller 103 includes inverting circuit 203 and NAND circuit 204. This structure is preferable to implementing the circuit based on complementary metal oxide semiconductors (CMOSs).

Each of delay elements 106, 107, and 108 constituting the multistage delay circuit as the multistage delay part delays an input signal by time T and output the delayed signal. Using reference signal 105 as signal A, delay element 106 delays signal A by time T to generates signal B. Delay element 107 delays signal B by time T to generate signal C. Delay element 108 delays signal C by time T to generate signal D. Signal C is also fed into signal controller 103, as control signal 104.

XOR elements 116, 117, and 118 perform exclusive OR operations on the corresponding input signals and outputs the results. XOR element 116 XORs signal A and signal B and outputs signal K. XOR element 117 XORs signal B and signal C and outputs signal L. XOR element 118 XORs signal C and signal D and outputs signal M.

Voltage adding element 121 outputs the voltage addition of signal K and signal M.

Amplifier 122 amplifies signal L at a prescribed magnification factor. Amplifier 123 amplifies the output signal from voltage adding element 121 at a prescribed magnification factor. The output signals from amplifier 122 and amplifier 123 are synthesized to provide signal source signal Q.

Waveform generator 131 outputs first control signal 132 indicating time 0 through T and time 3T through 4T, and second control signal 133 indicating time T through 3T both from the timing at which the impulse waveform is to be generated. Now, T is time length T described above. 3T is the time length three times of time length T, and 4T is the time length four times of time length T.

Figure 3A:
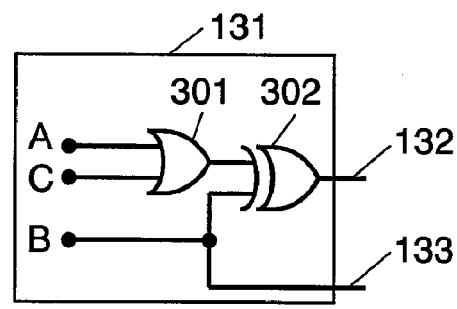
FIG. 3A is a block diagram illustrating an example of a structure of a waveform generator of the impulse waveform generating apparatus in accordance with the first exemplary embodiment.

FIG. 3A is a block diagram illustrating an example of a structure of the waveform generator in accordance with the first exemplary embodiment of the present invention. With reference to FIG. 3A, in waveform generator 131, OR element 301 ORs signal A and signal C, and XOR element 302 further XORs the result and signal B, to generate first control signal 132 indicating time 0 through T and time 3T through 4T from the timing at which the impulse waveform is to be generated. Signal B is output without any change as second control signal 133 indicating time T through 3T.

Figure 3B:
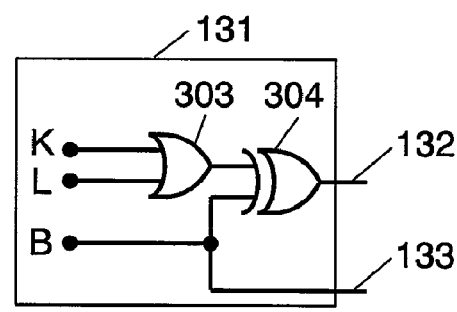
FIG. 3B is a block diagram illustrating an example of the structure of the waveform generator of the impulse waveform generating apparatus in accordance with the first exemplary embodiment.

Waveform generator 131 can also be implemented by another structure. FIG. 3B is a block diagram illustrating another example of the structure of the waveform generator in accordance with the first exemplary embodiment. With reference to FIG. 3B, waveform generator 131 includes OR element 303 for ORing signal K and signal L, and XOR element 304 for further XORing the result and signal B.

Delay element 134 delays first control signal 132 by time T/2. Delay element 135 delays second control signal 133 by time T/2.

Amplifiers 136 and 137 amplify the corresponding signals at prescribed magnification factors. The output signals from amplifiers 136 and 137 are synthesized to provide envelope formation signal R.

Mixer 138 multiplies signal source signal Q by envelope formation signal R to provide prescribed impulse waveform signal S.

Amplification factors b, a, β, and α of amplifiers 122, 123, 136, and 137, respectively, in this exemplary embodiment are described later.

In such a structure, the operation of generating an impulse waveform signal in impulse waveform generating apparatus 100 of this exemplary embodiment is described Impulse waveform generating apparatus 100 receives, from clock generating part 101, timing signal 102 that has time width Tau of at least 2T and shorter than 4T indicating the timing at which the impulse waveform is to be generated. When control signal 104 is in the H state, signal controller 103 outputs timing signal 102, as reference time signal 105. When control signal 104 is in the L state, the signal controller stops the output.

Delay element 106 generates signal B delayed from signal A, i.e. reference time signal 105, by time T. Delay element 107 generates signal C further delayed by time T. Delay element 108 generates signal D further delayed by time T. At this time, signal C, i.e. a signal indicating lapse of time 2T from the generation of timing signal 102, is fed into signal controller 103, as control signal 104, to adjust the time width of reference time signal 105 to 2T.

XOR elements 116, 117, and 118 generate signals K, L, and M, respectively, i.e. the results of XOR operations from signals A, B, C, and D. Further, voltage adding element 121 outputs the voltage addition of signal K and signal M. Amplifier 122 amplifies signal L at a prescribed magnification factor. Amplifier 123 amplifies the output signal from voltage adding element 121 at a prescribed magnification factor. The output signals from amplifiers 122 and 123 are synthesized to provide signal source signal Q.

Further, waveform generator 131 outputs first control signal 132 indicating time 0 through T and time 3T through 4T, and second control signal 133 indicating time T through 3T both from the timing at which the impulse waveform is to be generated.

Delay element 134 delays first control signal 132 by time T/2. Delay element 135 delays second control signal 133 by time T/2. Amplifiers 136 and 137 amplify the corresponding signals at prescribed magnification factors. The output signals from amplifiers 136 and 137 are synthesized to provide envelope formation signal R.

Finally, mixer 138 multiplies signal source signal Q by envelope formation signal R to provide prescribed impulse waveform signal S.

Next, a description is provided of respective signals generated in impulse waveform generating apparatus 100 of this exemplary embodiment.

Figure 4:
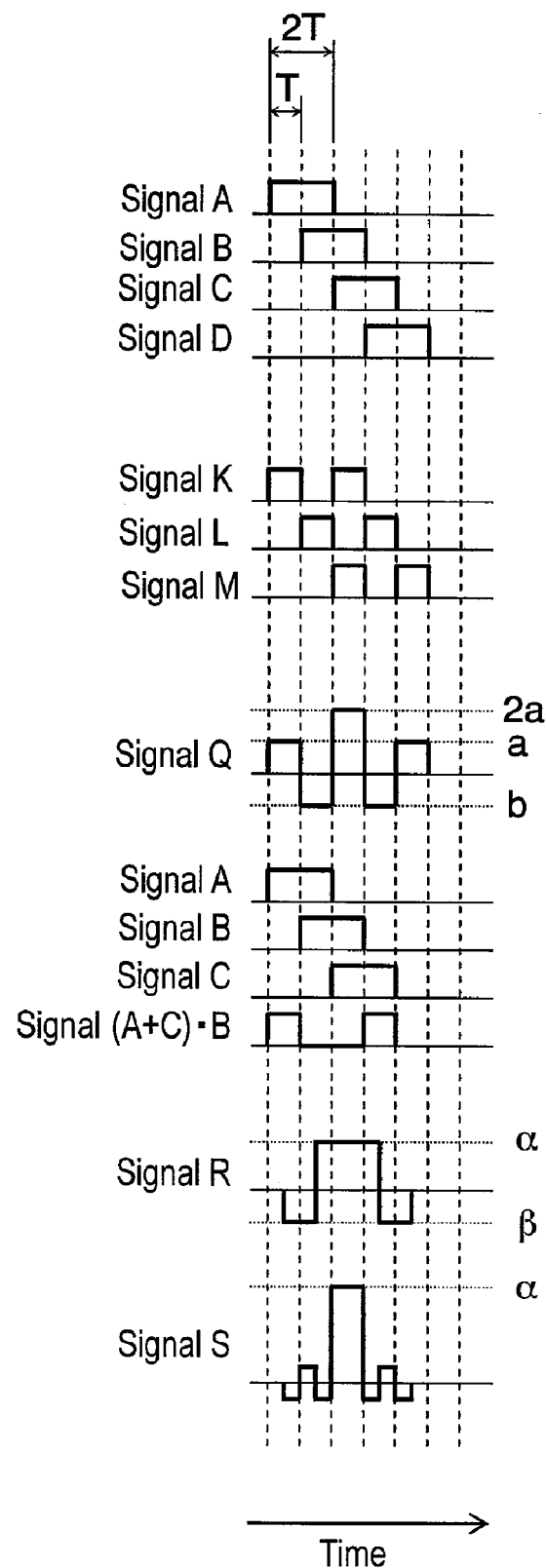
FIG. 4 is a timing diagram in the impulse waveform generating apparatus in accordance with the first exemplary embodiment.

FIG. 4 is a timing diagram in the impulse waveform generating apparatus in accordance with the first exemplary embodiment of the present invention. With reference to FIG. 4, signals A, B, C, and D are generated as signals each having time width 2T, with time difference T. Signals K, L, and M are pulse signals having time interval T and time width T obtained by XORing signal A and signal B, signal B and signal C, and signal C and signal D, respectively, and are generated with time difference T. Signal source signal Q is generated as an iterative signal waveform every time T that is synthesized by amplifiers 122 and 123 so that the addition of signals K and M are positive and signal L is negative.

First control signal 132 is generated as a negative signal waveform resulting from a logical operation of (A+C)·B by waveform generator 131. Second control signal 133 is generated as a positive signal waveform only from signal B by waveform generator 131. Envelope formation signal R is generated by envelope formation signal generating part 152 so as to delay by T/2 with respect to signal source signal Q. At this time, in envelope formation signal generating part 152, delay elements 134 and 135 delay first control signal 132 and second control signal 133 by T/2, respectively, and further amplifiers 136 and 137 amplify the respective signals. The negative amplified value of delayed first control signal 132 and the positive amplified value of delayed second control signal 133 are synthesized to provide envelope formation signal R.

Impulse waveform signal S is generated as a signal waveform by synthesizing signal source signal Q and envelope formation signal R using mixer 138.

Next, a description is provided of the characteristics of the impulse waveform signals generated in the impulse waveform generating apparatus of this exemplary embodiment.

As described above, ideal impulse waveform F(t) that has band center frequency F0 and bandwidth W is defined by [Eq. 1]. For an impulse waveform that has a frequency band ranging from frequency FL to frequency FH inclusive, band center frequency F0 is expressed by (FH+FL)/2, and bandwidth W is expressed by (FH−FL)/2.

Assuming that bandwidth W is 1/N (N being an integer) of band center frequency F0, i.e. W=F0/N, impulse waveform F(t) is expressed by [Eq. 2]:

$$F(t) = \cos(2F0\pi t)\frac{\sin(2F0\pi t/N)}{\pi t} \qquad [\text{Eq. 2}]$$

In [Eq.2], the term of cos indicates a reference signal having frequency F0, and the term including sin indicates an N frequency division signal having amplitude varying with time of the signal in which the reference signal is subjected to phase shift by 90° at frequency F0.

Now, a description is provided of a structure for generating a impulse waveform that has center frequency F0 and bandwidth W equal to those of the ideal impulse waveform, i.e. a waveform having W=F0 and N=1, for example.

Figure 5A:
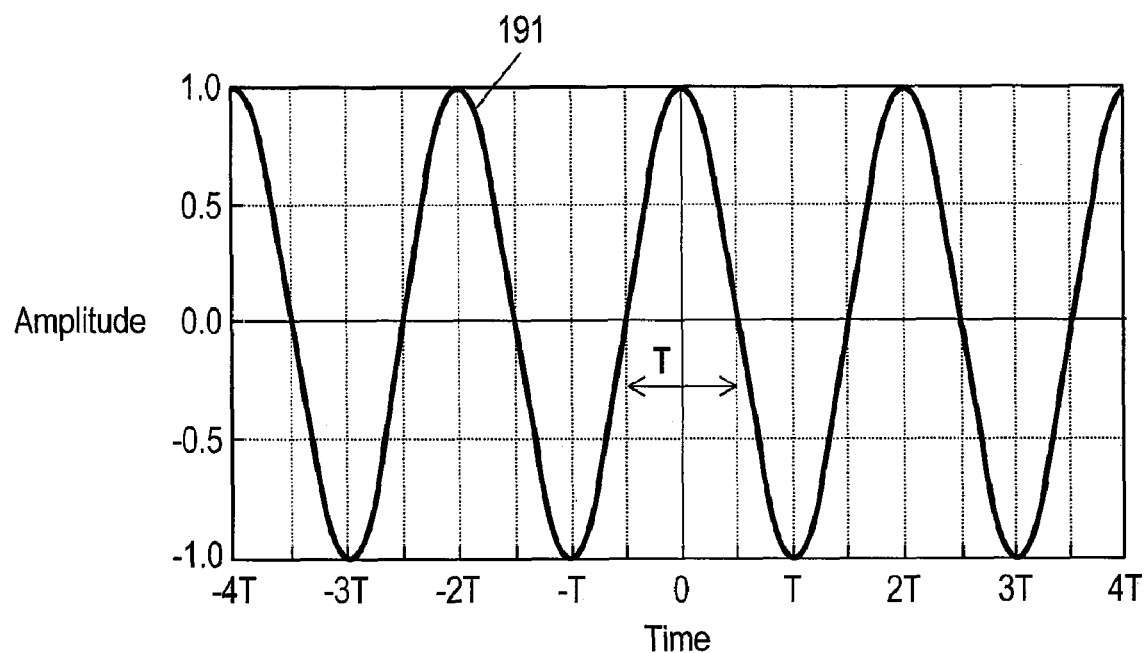
FIG. 5A is a graph showing characteristics of an example of a frequency component waveform of an impulse waveform.

FIG. 5A is a graph showing characteristics of an example of a frequency component waveform of an impulse waveform. Frequency component waveform 191 shows the waveform indicated by the cos term in [Eq. 2]

Figure 5B:
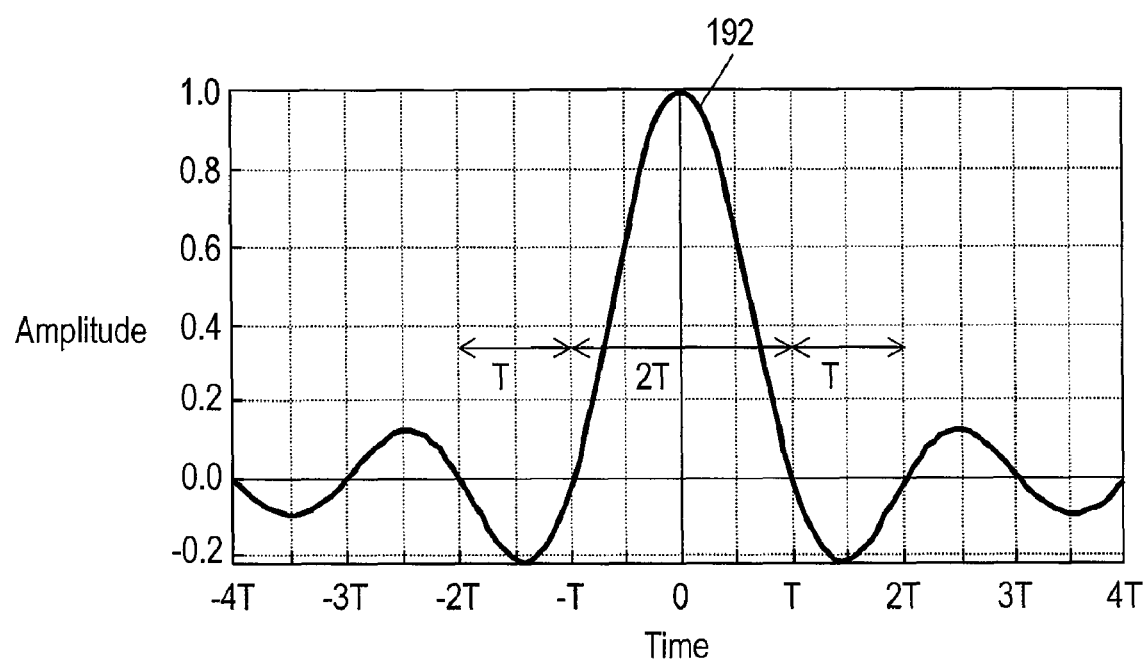
FIG. 5B is a graph showing characteristics of an example of an amplitude component waveform of the impulse waveform.

FIG. 5B is a graph showing characteristics of an example of an amplitude component waveform of the impulse waveform. Amplitude component waveform 192 shows the waveform indicated by the sin term in [Eq.2].

Figure 5C:
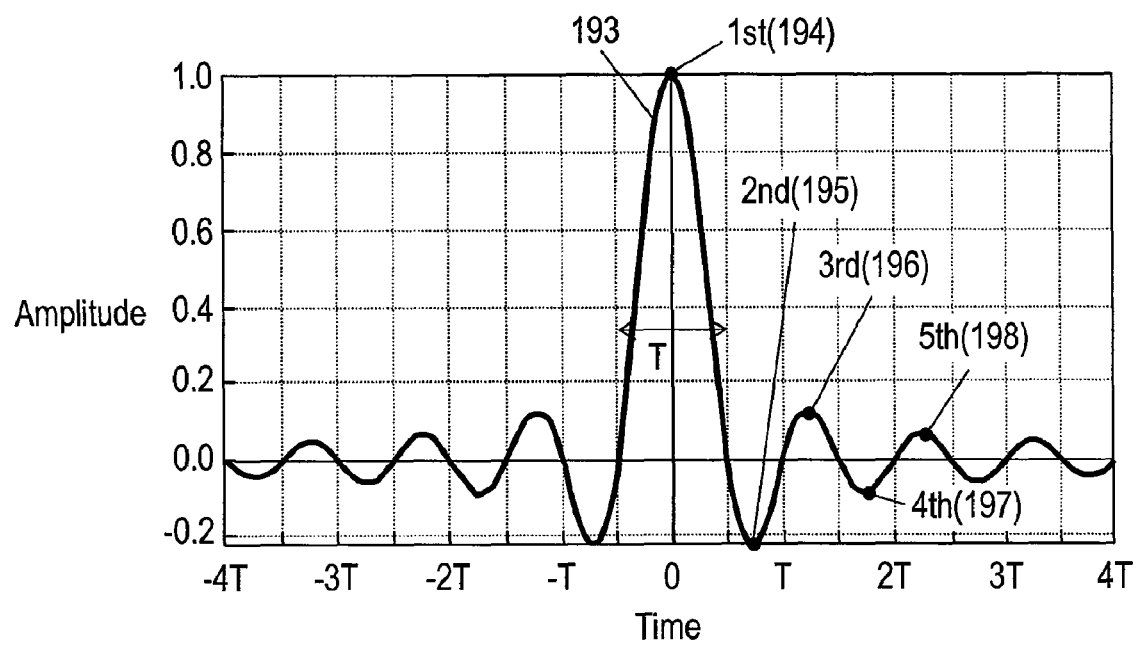
FIG. 5C is a graph showing characteristics of an example of the impulse waveform.

FIG. 5C is a graph showing characteristics of an example of the impulse waveform. Impulse waveform 193 shows impulse waveform F(t) expressed by [Eq.2]. In FIG. 5C, the first through fifth crest values of impulse waveform 193 are the amplitudes indicated by points 194 through 198, respectively. At this time, the theoretical values of the first through fifth crest values of impulse waveform F(t) (193) are 1.000 (194), −0.214 (195), 0.129 (196), −0.091 (197), and 0.071 (198).

Figures 6, 7:
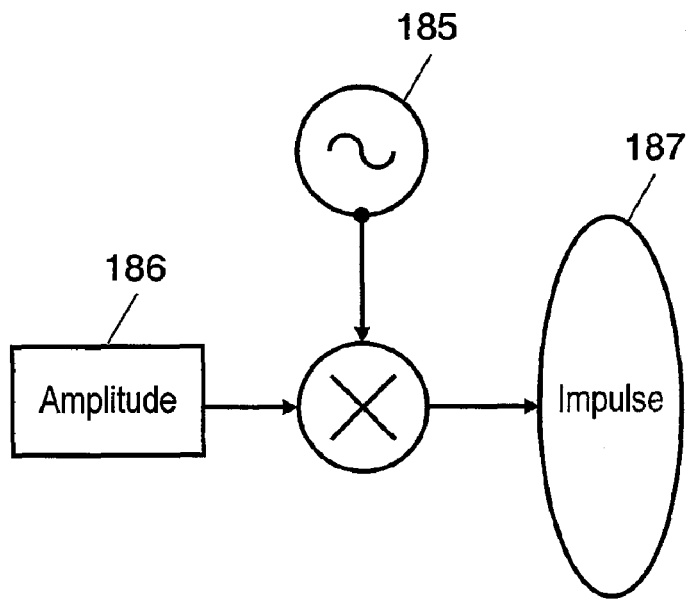
FIG. 6 is a diagram showing the operation of generating an impulse waveform from a frequency component waveform and an amplitude component waveform.
FIG. 7 is a table showing crest values of an output signal from the impulse waveform generating apparatus in accordance with the first exemplary embodiment.

FIG. 6 is a diagram showing the operation of generating an impulse waveform from a frequency component waveform and an amplitude component waveform. Impulse waveform F(t) (187) is synthesized by integration of frequency component waveform (185) and amplitude component waveform (186).

In impulse waveform generating apparatus 100 of this exemplary embodiment, the timing corresponding to the cos term in [Eq.2] is defined by signal source signal Q, and the timing corresponding to the sin term in [Eq.2] is defined by envelope formation signal R.

Further, in impulse waveform generating apparatus 100, the crest values of impulse waveform signal S corresponding to the respective crest values of impulse waveform F(t) are defined by values of the amplification factors of amplifiers 122, 123, 136, and 137. Particularly, to obtain impulse waveform signal S having more highly precise crest values with respect to the ideal impulse waveform of [Eq.2], amplification factors b, a, β, and α of amplifiers 122, 123, 136, and 137 are set at −0.214, 0.500, −0.603, and 1.000, respectively. Now, a positive amplification factor shows the magnification factor at which a supplied signal is amplified. For a negative amplification factor, the absolute value thereof is the magnification factor, and a signal further subjected to phase inversion is output. Hereinafter, the same notation is used. These values can be determined by calculation formulas according to the circuit arrangement. The number of digits of the effective numerical value can be determined according to the elements constituting the circuit, conditions for the manufacturing process, and other factors.

FIG. 7 is a table showing crest values of an output signal from impulse waveform generating apparatus 100 in accordance with the first exemplary embodiment. In FIG. 7, the true values are the first through fifth crest values in FIG. 5C, and the instances are the crest values of impulse waveform signal S obtained by the above amplification factor settings.

The first through fourth crest values of the impulse waveform generated by the impulse waveform generating apparatus of this exemplary embodiment can be calculated by calculation formulas "2αa", "αb", "βb", and "βa", respectively. These values are 1.000 (161), −0.214 (162), 0.129 (163), and −0.301 (164), and can be made correspond with the true values of the first through third crest values of impulse wave signal S. Thus, impulse waveform generating apparatus 100 provides a waveform that has characteristics close to those of the ideal waveform of FIG. 5C, with errors of approximately 20% with respect to the maximum amplitude in the fourth crest value. In this exemplary embodiment, the fifth crest value is not reproduced.

With this structure, impulse waveform generating apparatus 100 of this exemplary embodiment can generate a signal to be an impulse signal source using the multistage delay elements even without an oscillator, and multiply the signal by an envelope formation signal, thereby generating an impulse waveform.

Further, in impulse waveform generating apparatus 100, appropriate amplification parameters can be set in multiplication of the signals to generate an impulse waveform having highly precise crest values.

Further, in impulse waveform generating apparatus 100, a signal output from a multistage delay element is fed into the signal controller as a control signal to allow the apparatus to operate at an accurate timing even with variations in the length of input clock signals.

In the description of impulse waveform generating apparatus 100 of this exemplary embodiment, N=1. However, even in an embodiment in which N is 2 or larger, the same structure can be used.

Figure 3C:
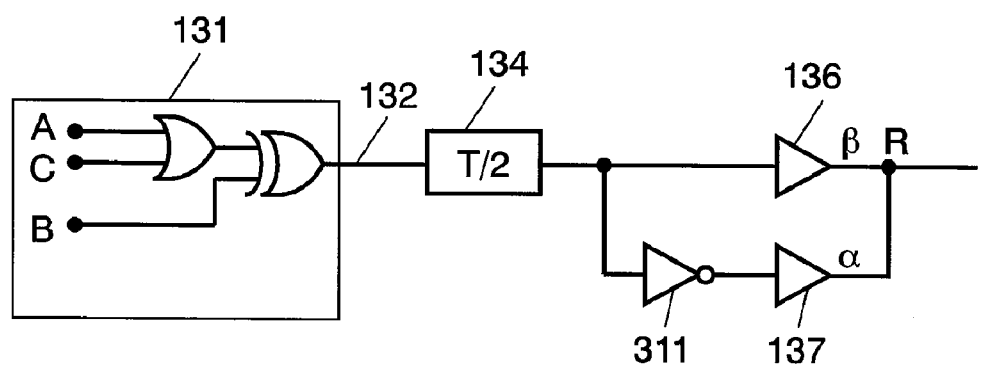
FIG. 3C is a partial block diagram illustrating an example of a structure for generating envelope formation signal R in the impulse waveform generating apparatus in accordance with the first exemplary embodiment.
Figure 3D:
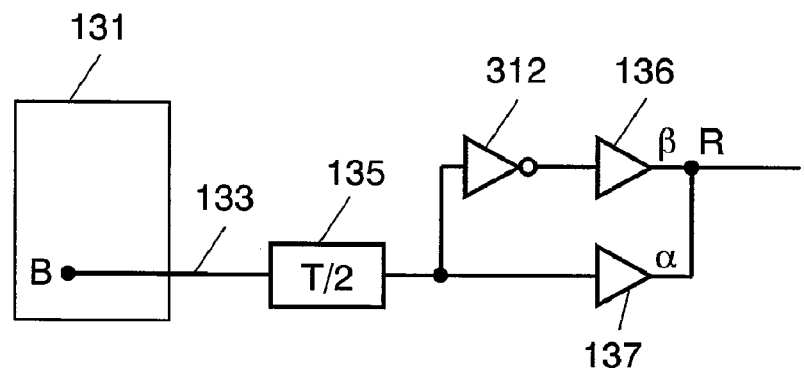
FIG. 3D is a partial block diagram illustrating another example of the structure for generating envelope formation signal R in the impulse waveform generating apparatus in accordance with the first exemplary embodiment.

In the description of impulse waveform generating apparatus 100 of this exemplary embodiment, waveform generator 131 in envelope signal generating part 152 generates first control signal 132 and second control signal 133, and these two signals form envelope formation signal R. However, even when waveform generator 131 generates envelope formation signal R from either one of these control signals, the same advantage can be given. FIG. 3C is a partial block diagram illustrating an example of a structure for generating an envelope formation signal in the impulse waveform generating apparatus in accordance with the first exemplary embodiment. With reference to FIG. 3C, the inverted signal of first control signal 132 is used in place of the second control signal. FIG. 3D is a partial block diagram illustrating another example of the structure for generating an envelope formation signal in the impulse waveform generating apparatus in accordance with the first exemplary embodiment. With reference to FIG. 3D, the inverted signal of the first control signal is used in place of second control signal 133. In impulse waveform generating apparatus 100, such simplified circuit arrangements omitting one of delay elements 134 and 135 as adjusting-delay elements give a useful advantage of further reducing the power consumption.

In impulse waveform generating apparatus 100 of this exemplary embodiment, the delay time of delay elements 134 and 135 as the adjusting-delay elements is set at T/2 so that the delay time of envelope formation signal R with respect to signal source signal Q is T/2. The same advantages can be given by a structure in which the delay time is adjusted according to the characteristics of the elements constituting the circuit, conditions for the manufacturing process and other factors.

In the above descriptions, impulse waveform generating apparatus 100 separately generates the frequency component and the amplitude component of an impulse waveform to be output, and multiplies these two signals in the mixer part, to generate the impulse waveform for output. The impulse waveform generating apparatus may be structured to generate a synthesizing signal indicating the frequency component or the amplitude component, for example, and include an additional mixer part for further multiplying the impulse waveform output from the original mixer part by the synthesizing signal.

Figure 8:
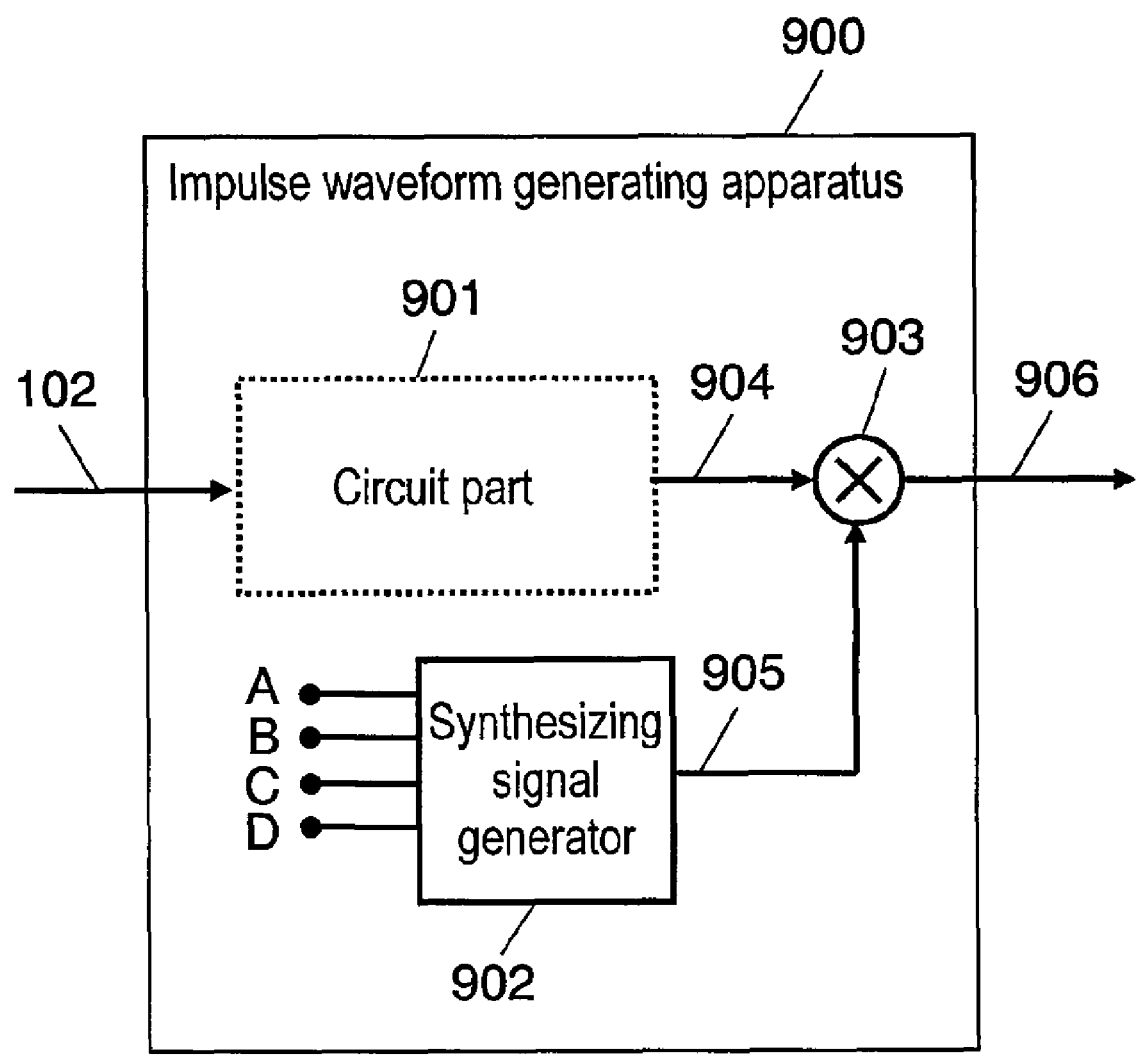
FIG. 8 is another block diagram of the impulse waveform generating apparatus in accordance with the first exemplary embodiment.

FIG. 8 is a block diagram of impulse waveform generating apparatus 900 in accordance with the first exemplary embodiment of the present invention. With reference to FIG. 8, impulse waveform generating apparatus 900 includes the following elements: circuit part 901 for generating impulse waveform signal 904 from timing signal 102; synthesizing signal generator 902 for generating synthesizing signal 905 indicating the frequency component or the amplitude component; and additional mixer part 903 for multiplying impulse waveform signal 904 by synthesizing signal 905 to generate another impulse waveform signal 906. Circuit part 901 has the same circuit arrangement as impulse waveform generating apparatus 100 of FIG. 1. With this structure, impulse waveform generating apparatus 900 can operate at a lower operational frequency with lower power consumption than impulse waveform generating apparatus 100.

Further, a description is provided of structuring a radio-frequency (RF) pulse waveform generating apparatus using impulse waveform generating apparatus 100 described above.

Figure 9A:
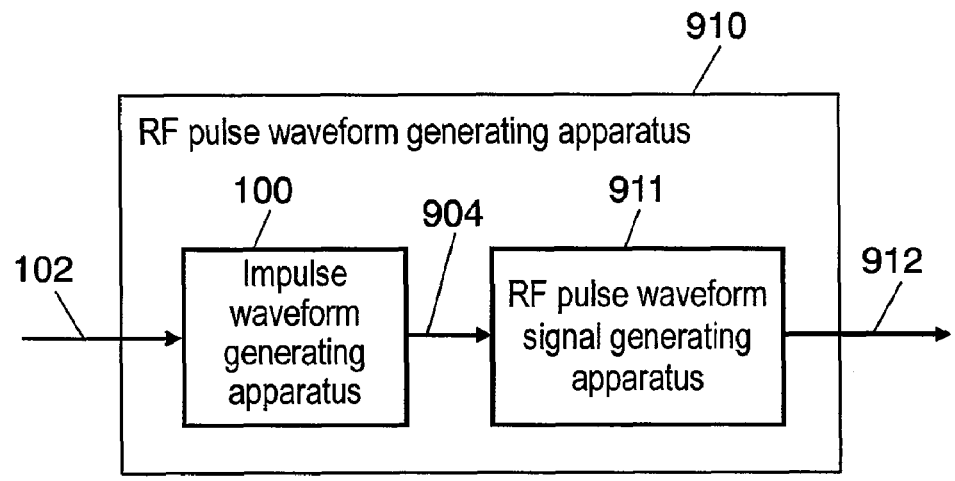
FIG. 9A is a block diagram of a radio-frequency (RF) pulse waveform generating apparatus in accordance with the first exemplary embodiment of the present invention.

FIG. 9A is a block diagram of RF pulse waveform generating apparatus 910 using impulse waveform generating apparatus 100 in accordance with the first exemplary embodiment of the present invention. With reference to FIG. 9A, RF pulse waveform generating apparatus 910 includes the following elements: impulse waveform generating apparatus 100; and RF pulse waveform signal generating part 911 for receiving impulse waveform signal 904 generated by impulse waveform generating apparatus 100, and generating RF pulse waveform signal 912. RF pulse waveform signal generating part 911 receives impulse waveform signal 904 as a control signal for controlling the operation of an intermittently-operating oscillator circuit, arbitrarily controls the output spectrum from the oscillator circuit or the output waveform, and generates RF pulse waveform signal 912.

Thus, RF pulse waveform generating apparatus 910 can generate RF pulse waveform signals having given spectra or waveforms as output signals. For this reason, the RF pulse waveform generating apparatus is useful for wireless equipment that incorporates RF pulse waveform generating apparatus 910 therein and transmits signals, for example.

Figure 9B:
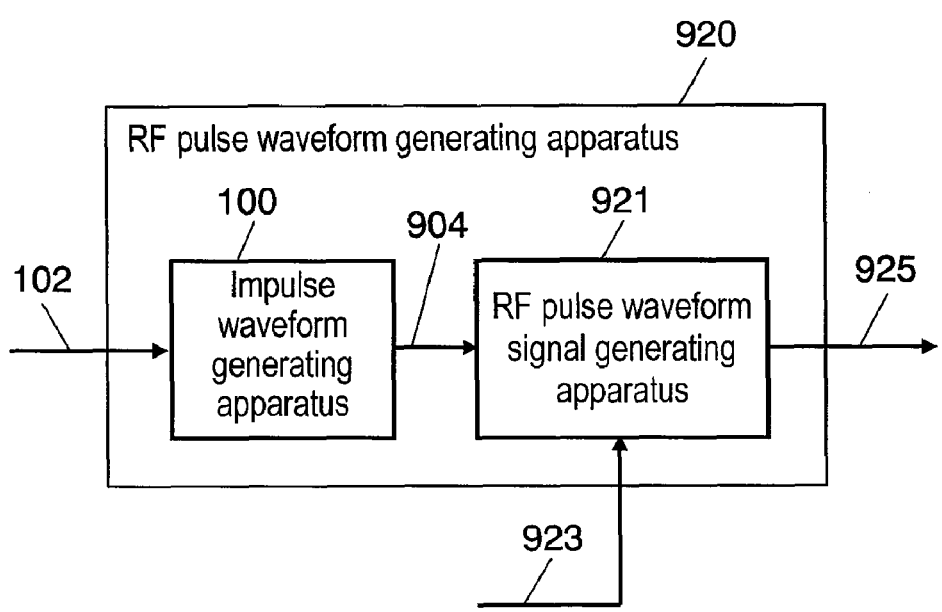
FIG. 9B is another block diagram of the RF pulse waveform generating apparatus in accordance with the first exemplary embodiment.

Further, wireless equipment based on the pulse waveform modulation scheme can be constructed using the waveform generated by the RF pulse waveform signal. This wireless equipment performs waveform modulation on the RF pulse waveform signal by using transmit data as the input signal into the RF pulse waveform signal generating part. FIG. 9B is a block diagram of RF pulse waveform generating apparatus 920 in accordance with the first exemplary embodiment to be incorporated into this wireless equipment. RF pulse waveform generating apparatus 920 has substantially the same structure as RF pulse waveform generating apparatus 910 of FIG. 9A. However, RF pulse waveform generating apparatus 920 is partly different from RF pulse waveform generating apparatus 910 in feeding, into RF pulse waveform signal generating part 921, transmit signal 923 transmitted from this wireless equipment, to generate RF pulse waveform signal 925 having undergone waveform modulation.

With this structure, this wireless equipment can perform communication, with more effective use of frequencies based on the degree of waveform separation. The methods of changing the frequency of the impulse waveform include the use of a common mixer.

The above descriptions do not include the timing adjustment between signal source signal generating part 151 and envelope formation signal generating part 152 in impulse waveform generating apparatus 100. However, because both of signal source signal generating part 151 and envelope formation signal generating part 152 use an identical signal from the clock generating part, the frequency drifts resulting from the time lapse in generation of the signal source signal and the envelope formation signal in theses parts are equal. The time deviation resulting from the number of circuits in use and the difference in the kinds of circuits can easily be adjusted by the use of a simple time difference detecting circuit and variable delay circuit, for example.

The above descriptions do not include the detailed method of correcting the frequency deviation, e.g. gain deviation and group delay deviation, of the amplifiers or mixer part in impulse waveform generating apparatus 100. The influence of the frequency deviation may be compensated by using a simple deviation detecting circuit, or measuring the deviation in advance to obtain the frequency deviation so that the frequency deviation is reflected in the frequency characteristics of the signal source signal, for example.

The above descriptions do not include the detailed method of correcting the distortion caused by the input signal strength of the amplifiers or mixer part in impulse waveform generating apparatus 100. The influence of the distortion may be compensated by using a simple distortion detecting circuit, or measuring and obtaining the distortion in advance so that the distortion is reflected in the characteristics of the envelope formation signal, for example.

Second Exemplary Embodiment

Next, a description is provided of an impulse waveform generating apparatus in accordance with the second exemplary embodiment of the present invention. Impulse waveform generating apparatus 100 of the first exemplary embodiment is structured to synthesize delay signals using XOR elements. In contrast, the impulse waveform generating apparatus of this exemplary embodiment is structured to synthesize delay signals using AND elements. In this structure, highly precise impulse waveforms can be generated by the circuit arrangement having a smaller number of gates than the structure of the first exemplary embodiment.

The structure and operation of the impulse waveform generating apparatus of this embodiment are substantially the same as those of the first exemplary embodiment. Thus, the descriptions of the common elements and operations are omitted and only differences are described.

A description is provided of a structure of an impulse waveform generating apparatus of this embodiment.

Figure 10:
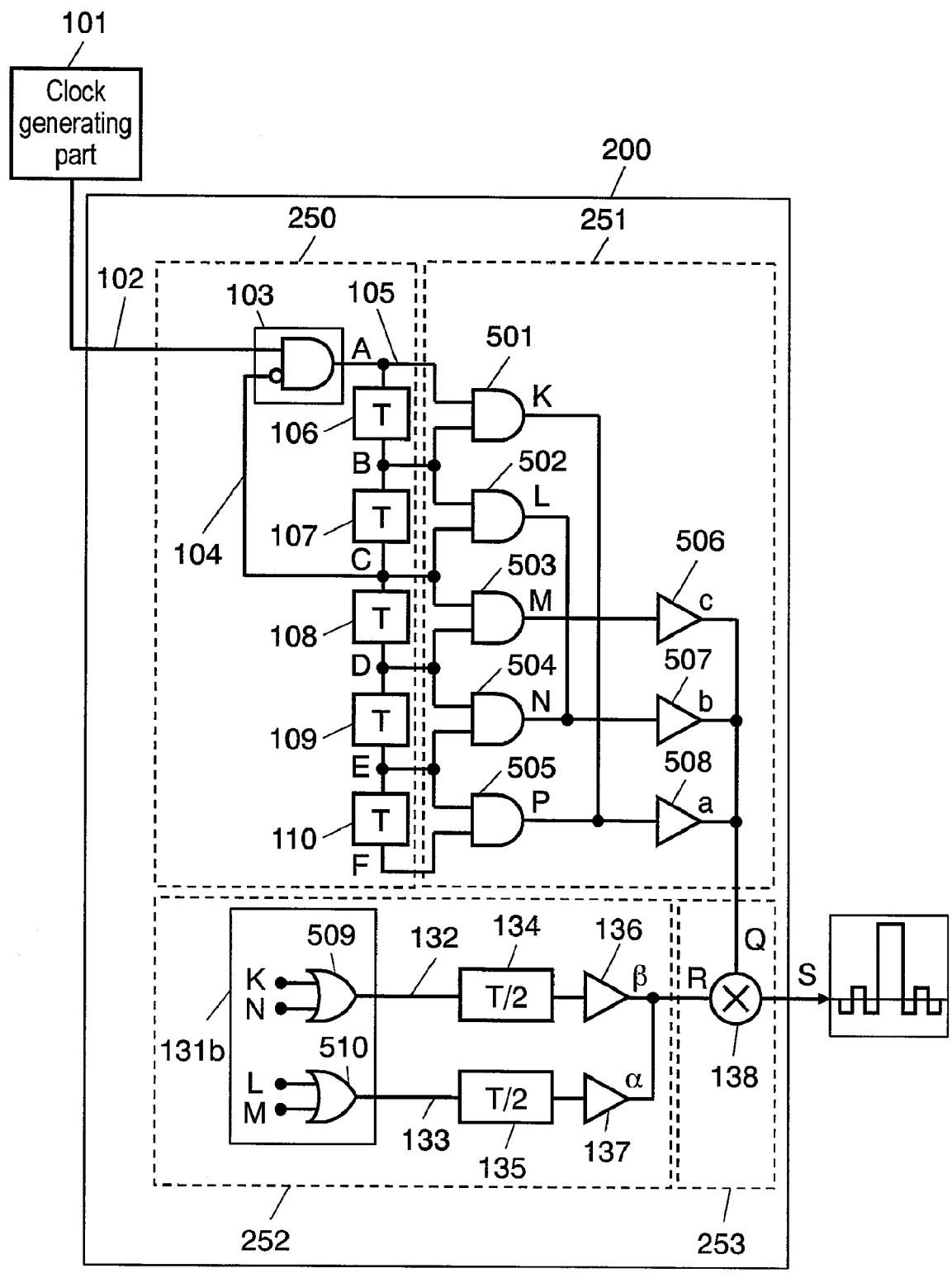
FIG. 10 is a block diagram of an impulse waveform generating apparatus in accordance with a second exemplary embodiment of the present invention.

FIG. 10 is a block diagram of an impulse waveform generating apparatus in accordance with the second exemplary embodiment of the present invention. With reference to FIG. 10, impulse waveform generating apparatus 200 is different from impulse waveform generating apparatus 100 of the first exemplary embodiment shown in FIG. 1 in the following structure. Impulse waveform generating apparatus 200 further includes delay elements 109 and 110 constituting a multistage delay circuit as a multistage delay part. Instead of the XOR elements 116, 117, and 118, the impulse waveform generating apparatus of this embodiment includes AND element 501 for supplying the AND of signal A and signal B, AND element 502 for outputting the AND of signal B and signal C, AND element 503 for outputting the AND of signal C and signal D, AND element 504 for outputting the AND of signal D and signal E, and AND element 505 for outputting the AND of signal E and signal F. Instead of amplifiers 122 and 123, the impulse waveform generating apparatus includes amplifier 506 for amplifying signal M at a prescribed magnification factor, amplifier 507 for amplifying signal L and signal N at a prescribed magnification factor, and amplifier 508 for amplifying signal K and signal P at a prescribed magnification factor. The impulse waveform generating apparatus also includes circuit 509 for outputting K+N, i.e. the AND of signal K and signal N, and circuit 510 for outputting L+M, i.e. the AND of signal L and signal M, in waveform generator 131b of FIG. 10.

In this exemplary embodiment, amplification factors c, b, a, β, and α of amplifiers 506, 507, 508, 136, and 137 are set at 1.000, −0.214, 0.151, −0.603, and 1.000, respectively.

A description is provided of the operation of impulse waveform generating apparatus 200 of this exemplary embodiment.

Impulse waveform generating apparatus 200 generates reference time signal 105 from timing signal 102 that is generated by clock generating part 101 and has time width Tau of at least 2T and shorter than 4T. In the impulse waveform generating apparatus, delay elements 106, 107, 108, 109, and 110 generate signal B delayed by time T from signal A, i.e. reference time signal 105, signal C further delayed from signal B by time T, signal D further delayed from signal C by time T, signal E further delayed from signal D by time T, and signal F further delayed from signal E by time T, respectively.

Next, in impulse waveform generating apparatus 200, AND elements 501, 502, 503, 504, and 505 generate signals K, L, M, N, and P, respectively, which result from the corresponding AND operations of signals A, B, C, D, E, and F. Amplifier 506 amplifies signal M, amplifier 507 amplifies the synthesized signal of signal L and signal N, and amplifier 508 amplifies the synthesized signal of signal K and signal P, based on the corresponding prescribed magnification factors. Then, the output signals from amplifiers 506, 507, and 508 are synthesized to provide signal source signal Q.

Further, in impulse waveform generating apparatus 200, waveform generator 131b generates first control signal 132 indicating time 0 through T and time 3T through 4T, and second control signal 133 indicating time T through 3T both from a timing at which an impulse waveform is to be generated. Then, delay element 134 as an adjusting-delay element delays first control signal 132 by time T/2, and delay element 135 as an adjusting-delay element delays second control signal 133 by time T/2. Amplifiers 136 and 137 amplify the corresponding signals at prescribed magnification factors. Then, the output signals from amplifiers 136 and 137 are synthesized to provide envelope formation signal R.

Finally, in impulse waveform generating apparatus 200, mixer 138 multiplies signal source signal Q by envelope formation signal R to provide prescribed impulse waveform signal S.

Next, a description is provided of respective signals generated in impulse waveform generating apparatus 200 of this exemplary embodiment.

Figure 11:
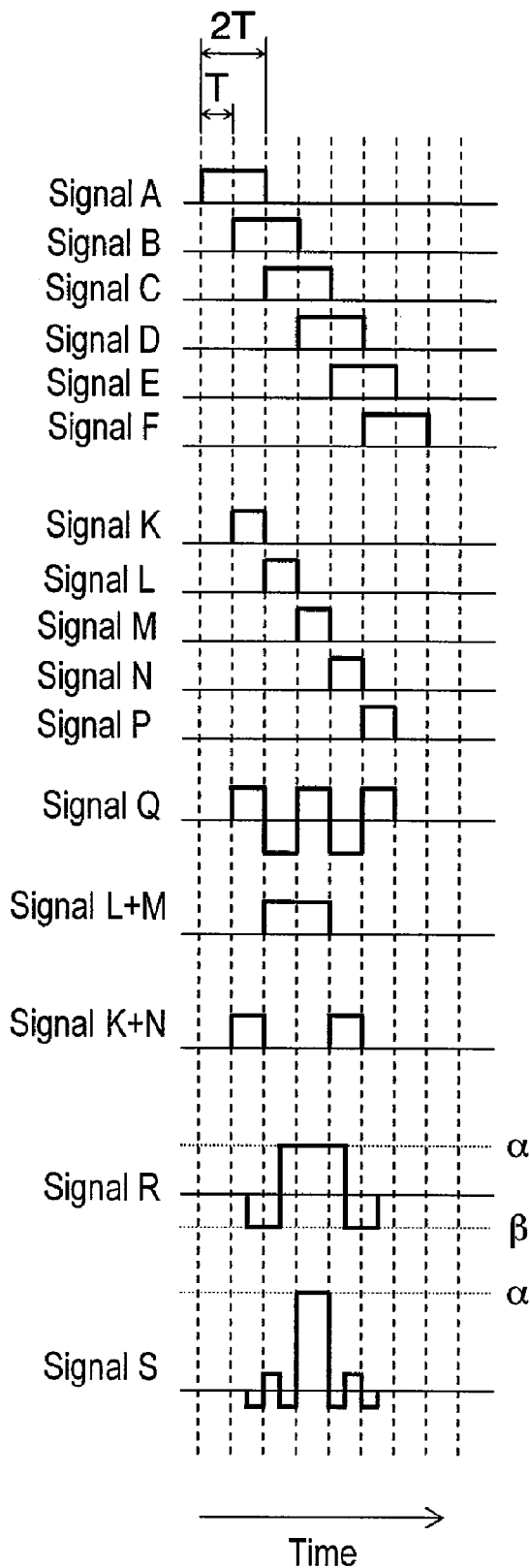
FIG. 11 is a timing diagram in the impulse waveform generating apparatus in accordance with the second exemplary embodiment.

FIG. 11 is a timing diagram in impulse waveform generating apparatus 200 in accordance with the second exemplary embodiment. In FIG. 11, signals A, B, C, D, E, and F are signals each having time width 2T, and sequentially generated with time difference T. Signals K, L, M, N, and P are the AND of signal A and signal B, the AND of signal B and signal C, the AND of signal C and signal D, the AND of signal D and signal E, and the AND of signal E and signal F, respectively. Signals K, L, M, N, and P are the signals each having time width T, and generated with time difference T. Signal source signal Q has a waveform obtained in the following manner. Amplifier 506 amplifies signal M at the positive prescribed magnification factor, amplifier 507 amplifies the addition of signals L and N at the negative prescribed magnification factor, and amplifier 508 amplifies the addition of signals K and P at the positive prescribed magnification factor. The respective output signals are synthesized. The signal source signal is generated as a signal waveform of which sign changes every time T.

First control signal 132 is generated by ORing signal K and signal N. Second control signal 133 is generated by ORing signal L and signal M. The waveforms of envelope formation signal R and impulse waveform signal S are generated by the same signal processing as the first exemplary embodiment.

Next, a description is provided of characteristics of the impulse waveform signals generated in impulse waveform generating apparatus 200 of this exemplary embodiment.

FIG. 12 is a table showing crest values of an output signal from the impulse waveform generating apparatus in accordance with the second exemplary embodiment. In FIG. 12, the true values are the theoretical values of the first through fifth crest values in FIG. 5C, and the instances are the crest values of impulse waveform signal S obtained by the above amplification factor settings. The first through fourth crest values generated in impulse waveform generating apparatus 200 of this exemplary embodiment can be calculated by calculation formulas "αc", "αb", "βb", and "βa", respectively. These values are 1.000 (261), −0.214 (262), 0.129 (263), and −0.091 (264), and can be made correspond with the true values of the first through fourth crest values of impulse wave signal S. Thus, the impulse waveform generating apparatus can generate an impulse waveform that has characteristics close to those of the ideal waveform of FIG. 5C, at higher precision than the first exemplary embodiment. In this exemplary embodiment, the fifth crest value is not reproduced.

With this structure, impulse waveform generating apparatus 200 of this exemplary embodiment synthesizes delay signals using AND elements instead of XOR elements. Thus, this impulse waveform generating apparatus can generate impulse waveforms at higher precision, using the circuit arrangement having a smaller number of gates than that of the impulse waveform generating apparatus 100 of the first exemplary embodiment.

In impulse waveform generating apparatus 200 of this exemplary embodiment, the delay time of delay elements 134 and 135 as the adjusting-delay elements is set at T/2 so that the delay time of envelope formation signal R with respect to signal source signal Q is T/2. The same advantages can be given by a structure in which the delay time is adjusted according to the characteristics of the elements constituting the circuit, conditions for the manufacturing process and other factors.

In impulse waveform generating apparatus 200 of this exemplary embodiment, second control signal 133 is generated from signal B. Instead, second control signal 133 can be generated from signal C. However, in this case, the difference in the gate delay time from the first control signal is larger. Because this large difference generates a difference in required delay time amount between delay elements 134 and 135 as adjusting-delay elements, the symmetry of the signals should be ensured.

Third Exemplary Embodiment

Next, a description is provided of an impulse waveform generating apparatus in accordance with the third exemplary embodiment of the present invention. Impulse waveform generating apparatus 200 of the second exemplary embodiment is structured to synthesize delay signals using AND elements. In contrast, the impulse waveform generating apparatus of this exemplary embodiment is structured to process delay signals using the combination of and elements and inverting elements. This structure reduces the delay time of a timing at which impulses are generated.

The structure and operation of the impulse waveform generating apparatus of this embodiment are substantially the same as those of impulse waveform generating apparatus 200 of the second exemplary embodiment. Thus, the descriptions of the common elements and operations are omitted and only differences are described.

A description is provided of a structure of an impulse waveform generating apparatus of this embodiment.

Figure 13:
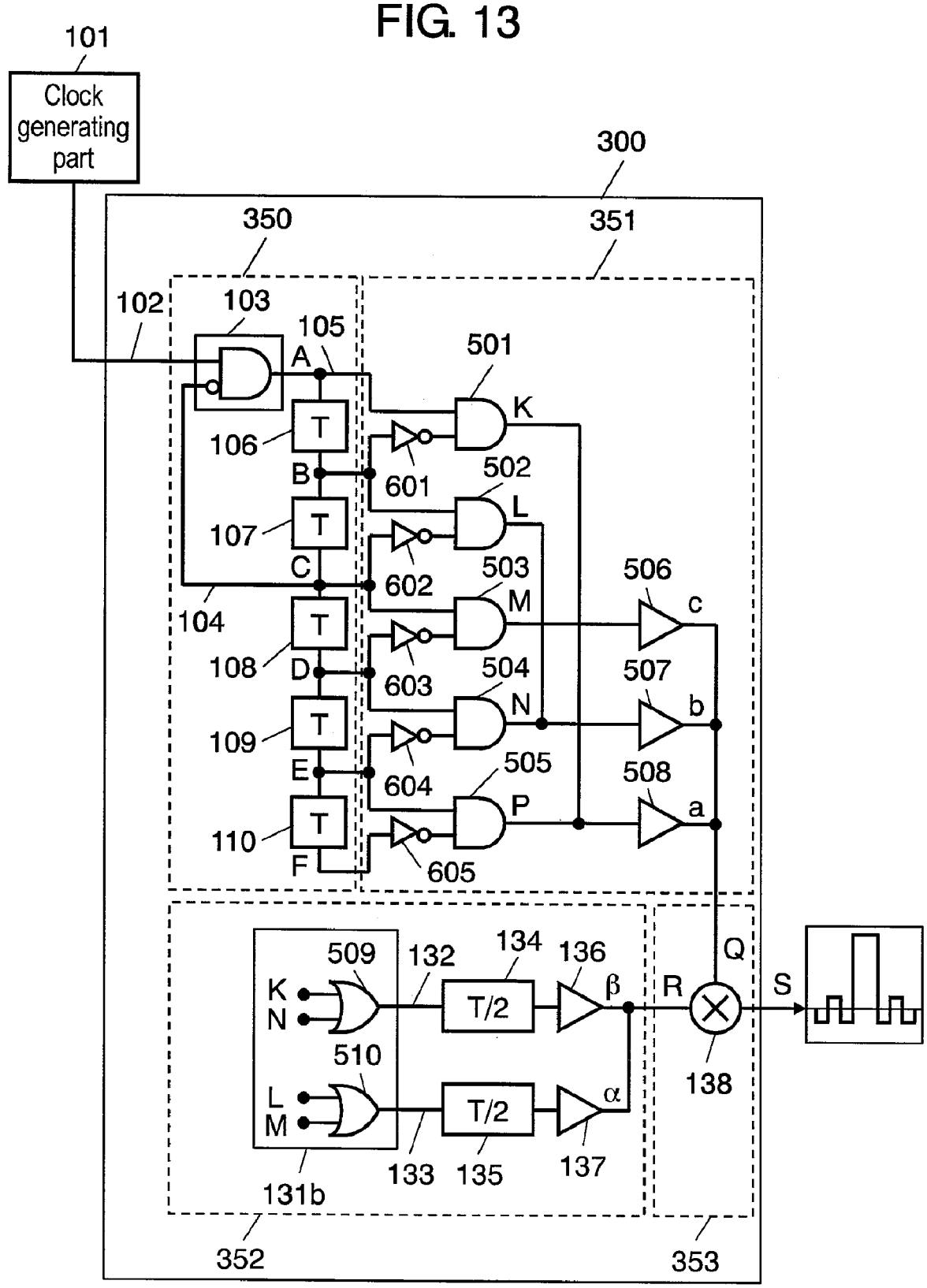
FIG. 13 is a block diagram of an impulse waveform generating apparatus in accordance with a third exemplary embodiment of the present invention.

FIG. 13 is a block diagram illustrating a structure of an impulse waveform generating apparatus in accordance with the third exemplary embodiment of the present invention. With reference to FIG. 13, impulse waveform generating apparatus 300 is different from impulse waveform generating apparatus 200 of the second exemplary embodiment in the following structure. The impulse waveform generating apparatus of this embodiment further includes inverting elements 601, 602, 603, 604, and 605 for inverting signals B, C, D, E, and F, before the signals are fed into AND elements 501, 502, 503, 504, and 505, respectively.

In impulse waveform generating apparatus 300 of this exemplary embodiment, amplification factors c, b, a, β, and α of amplifiers 506, 507, 508, 136, and 137 are set at 1.000, −0.214, 0.151, −0.603, and 1.000, respectively, like impulse waveform generating apparatus 200 of the second exemplary embodiment.

In such a structure, the operation of impulse waveform generating apparatus 300 of this exemplary embodiment is described.

Impulse waveform generating apparatus 300 generates reference time signal 105 from timing signal 102 that is generated by clock generating part 101 and has time width Tau of at least 2T and shorter than 4T. The reference time signal is delayed by delay elements 106, 107, 108, 109, and 110. Then, AND element 501 generates signal K resulting from the AND operation of signal A and the inverted signal of signal B. AND element 502 generates signal L resulting form the AND operation of signal B and the inverted signal of signal C. AND element 503 generates signal M resulting from the AND operation of signal C and the inverted signal of signal D. AND element 504 generates signal N resulting from the AND operation of signal D and the inverted signal of signal E. AND element 505 generates signal P resulting from the AND operation of signal E and the inverted signal of signal F. Thereafter, with the same signal processing as that of the second exemplary embodiment, signal source signal Q, envelop formation signal R, and prescribed impulse waveform signal S are generated.

Next, a description is provided of the respective signals generated in impulse waveform generating apparatus 300 of this embodiment.

Figure 14:
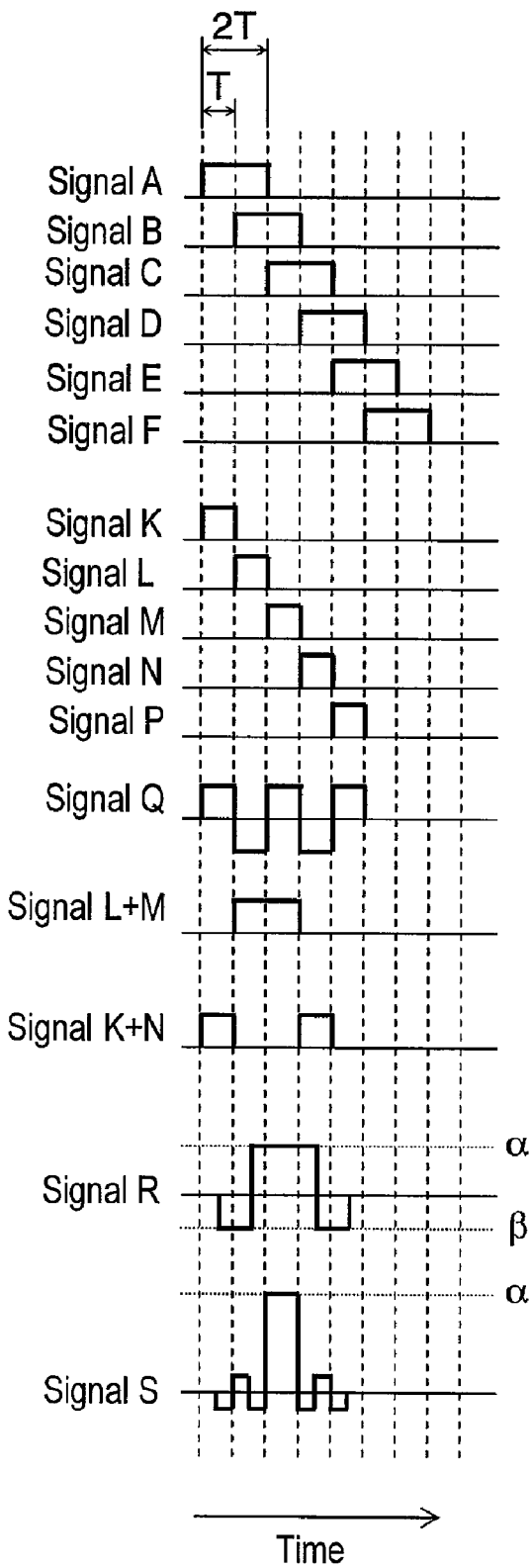
FIG. 14 is a timing diagram in the impulse waveform generating apparatus in accordance with the third exemplary embodiment.

FIG. 14 is a timing diagram in the impulse waveform generating apparatus in accordance with the third exemplary embodiment. The signal waveforms in FIG. 14 have the same shapes as the signal waveforms of the second exemplary embodiment shown in FIG. 11. However, signals K, L, M, N, and P output from AND elements 501, 502, 503, 504, and 505, respectively, are generated at timings earlier by one frame, i.e. cycle T, than those of the second exemplary embodiment. The signals in the subsequent processing are also generated at timings earlier by cycle T.

Next, a description is provided of the characteristics of the impulse waveform signals generated in impulse waveform generating apparatus 300 of this exemplary embodiment.

FIG. 15 is a table showing crest values of an output signal from the impulse waveform generating apparatus in accordance with the third exemplary embodiment. The first through fourth crest values generated in impulse waveform generating apparatus 300 of this exemplary embodiment can be calculated by calculation formulas "αc", "αb", "βb", and "βa", respectively. These values are 1.000 (361), −0.214 (362), 0.129 (363), and −0.091 (364), and can be made correspond with the true values of the first through fourth crest values of impulse wave signal S. Thus, like impulse waveform generating apparatus 200 of the second exemplary embodiment, impulse waveform generating apparatus 300 can generate an impulse waveform that has characteristics close to those of the ideal waveform of FIG. 5C, at higher precision than impulse waveform generating apparatus 100 of the first exemplary embodiment.

With this structure, impulse waveform generating apparatus 300 of this exemplary embodiment uses the combination of AND elements and inverting elements in processing the delay signals. This structure can make the timings at which signals K, L, M, and N are generated time T earlier than those of the second exemplary embodiment, thereby reducing the delay time of the timing at which impulses are generated.

In impulse waveform generating apparatus 300 of this exemplary embodiment, the delay time of delay elements 134 and 135 as the adjusting-delay elements is set at T/2 so that the delay time of envelope formation signal R with respect to signal source signal Q is T/2. The same advantages can be given by a structure in which the delay time is adjusted according to the characteristics of the elements constituting the circuit, conditions for the manufacturing process and other factors.

Fourth Exemplary Embodiment

Next, a description is provided of an impulse waveform generating apparatus in accordance with the fourth exemplary embodiment of the present invention. In impulse waveform generating apparatus 100 of the first exemplary embodiment, delay elements constituting the multistage delay pulse signal generating part are arranged in series to generate delay pulse signals. In contrast, in the impulse waveform generating apparatus of this exemplary embodiment, delay elements having delay times incremented by time T are arranged in parallel to generate delay pulse signals. This arrangement can change the accuracy required for the delay elements, from delay time T to delay time difference T. Thus, the delay time resulting from the operational delay in the circuit need not be considered when the circuit is designed.

The structure and operation of the impulse waveform generating apparatus of this embodiment are substantially the same as those of the first exemplary embodiment. Thus, the descriptions of the common elements and operations are omitted and only differences are described.

A description is provided of a structure of an impulse waveform generating apparatus of this embodiment.

Figure 16:
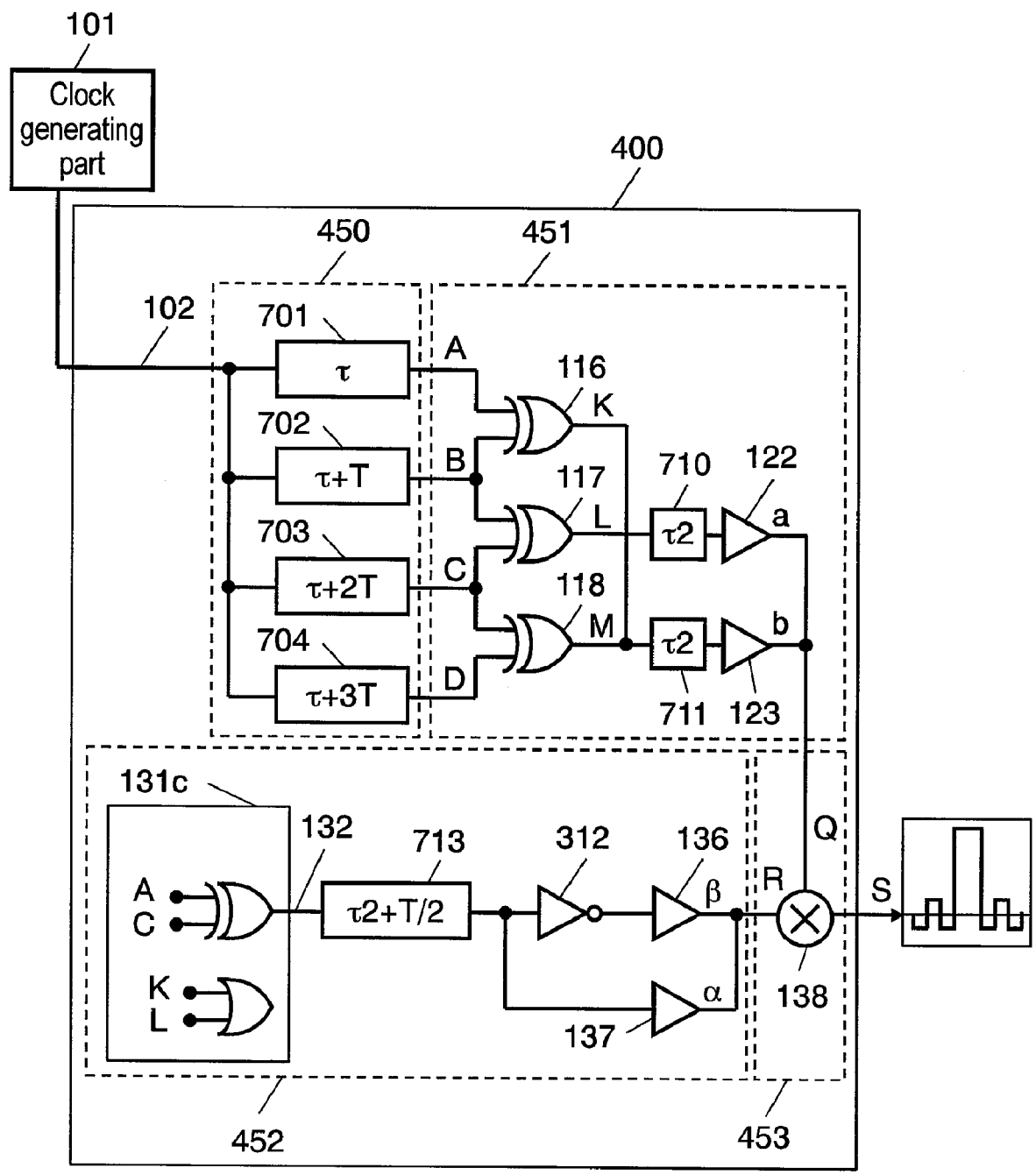
FIG. 16 is a block diagram of an impulse waveform generating apparatus in accordance with a fourth exemplary embodiment of the present invention.

FIG. 16 is a block diagram illustrating a structure of an impulse waveform generating apparatus in accordance with the fourth exemplary embodiment of the present invention. With reference to FIG. 16, impulse waveform generating apparatus 400 is different from impulse waveform generating apparatus 100 of the first exemplary embodiment in the following structure.

Instead of signal controller 103, and delay elements 106, 107, and 108 constituting the multistage delay circuit as the multistage delay part, multistage delay pulse signal generating part 450 includes delay elements 701, 702, 703, and 704 constituting a parallel delay circuit. Delay element 701 generates signal A by delaying timing signal 102 by time τ. Delay element 702 generates signal B by delaying timing signal 102 by time τ+T. Delay element 703 generates signal C by delaying timing signal 102 by time τ+2T. Delay element 704 generates signal D by delaying timing signal 102 by time τ+3T.

Signal source signal generating part 451 includes delay element 710 for delaying signal L by time τ2 as a signal source delay element, and delay element 711 for delaying K+M, i.e. the OR of signal K and signal M, by time τ2 as a signal source delay element.

Instead of waveform generator 131, envelope formation signal generating part 452 includes waveform generator 131c for XORing signal A and signal C to output a second control signal. Instead of the circuit for generating envelope formation signal R from the first control signal 132, the envelope formation signal generating part includes delay element 713 for delaying the first control signal 132 by time τ2+T/2 as another adjusting-delay element, and a circuit for amplifying the signal and an inverted signal thereof based on corresponding prescribed magnification factors and synthesizing the amplified signals.

In impulse waveform generating apparatus 400 of this exemplary embodiment, time τ and τ2 are set at values larger than cycle T and shorter than the minimum value of the pulse interval. Amplification factors a, b, β, and α of amplifiers 122, 123, 136, and 137 are set at 1.000, −0.214, −0.603, and 1.000, respectively.

A description is provided of the operation of impulse waveform generating apparatus 400 of this exemplary embodiment.

Impulse waveform generating apparatus 400 receives, from clock generating part 101, timing signal 102 that has time width Tau larger than 3T indicating a timing at which an impulse waveform is to be generated.

Delay elements 701, 702, 703, and 704 generate signal A delayed from timing signal 102 by time τ, signal B further delayed from signal A by time T, signal C further delayed from signal B by time T, and signal D further delayed from signal C by time T, respectively.

XOR elements 116, 117, and 118 generates XOR signals K, L, and M, respectively, from signals A, B, C, and D. Delay elements 710 and 711 as signal source delay elements output the synthesized signal of signal K and signal M. Amplifier 122 amplifies a signal obtained by delaying signal L by time τ2 at the prescribed magnification factor. Amplifier 123 amplifies a signal obtained by synthesizing signal K and signal M and delaying the synthesized signal by time τ2 at the prescribed magnification factor. Then, the output signals from amplifiers 122 and 123 are synthesized to provide signal source signal Q.

Waveform generator 131c outputs first control signal 132 indicating time 0 through T and time 3T through 4T from the timing at which the impulse waveform is to be generated.

Delay element 713 delays first control signal 132 by time τ2+T/2. Amplifiers 136 and 137 amplify the signal and an inverted signal thereof based on the corresponding prescribed magnification factors, respectively. Then, the output signals from amplifiers 136 and 137 are synthesized to provide envelope formation signal R.

Finally, mixer 138 multiplies signal source signal Q by envelope formation signal R, to provide prescribed impulse waveform signal S.

Next, a description is provided of the respective signals in impulse waveform generating apparatus 400 of this exemplary embodiment.

Figure 17:
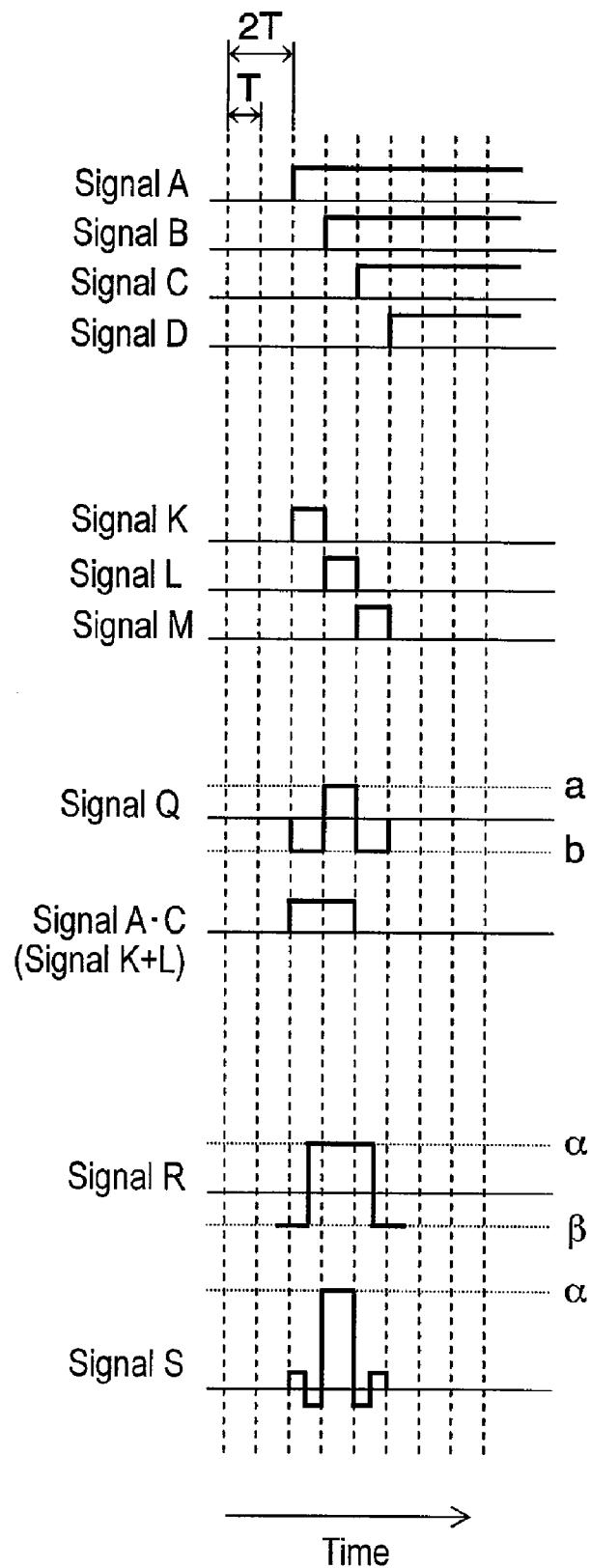
FIG. 17 is a timing diagram in the impulse waveform generating apparatus in accordance with the fourth exemplary embodiment.

FIG. 17 is a timing diagram in the impulse waveform generating apparatus in accordance with the fourth exemplary embodiment. In FIG. 17, signals A, B, C, and D are signals each having time width τ, and are generated by the delay elements. Signals K, L, and M are signals each having time length T, and are generated by the XOR elements. Now, because the delay difference between signal A and signal B is time T, signal K has time width T. Similarly, signal L having time width T is generated time T after the generation of signal K. Signal M having time width T is generated time 2T after the generation of signal K. Also signal source signal Q is generated as a waveform delayed by τ2. In FIG. 17, for comparison between the source waveforms and the generated waveforms, the displacement of the waveforms by time τ2 is omitted.

Envelope formation signal R is generated in the following manner. The XOR signal of signal A and signal C is delayed by time τ2+T/2. This signal and an inverted signal thereof are amplified based on the corresponding magnification factors and synthesized to provide a synthesized waveform.

Impulse waveform signal S is generated as a signal waveform resulting from the synthesis of signal source signal Q and envelope formation signal R by the same signal processing as the first exemplary embodiment. Thus, the waveform of impulse waveform signal S is obtained.

Next, a description is provided of the characteristics of the impulse waveform signals generated in the impulse waveform generating apparatus of this exemplary embodiment.

FIG. 18 is a table showing crest values of an output signal from the impulse waveform generating apparatus in accordance with the fourth exemplary embodiment of the present invention. In FIG. 18, the true values are the first through fifth crest values in FIG. 5C, and the instances are the crest values of impulse waveform signal S obtained by the above amplification factor settings. The first through third crest values of the impulse waveform generated by impulse waveform generating apparatus 400 can be calculated by calculation formulas "αa", "αb", and "βb", respectively. These values are 1.000 (461), −0.214 (462), and 0.129 (463), and can be made correspond with the theoretical values of the first through third crest values of impulse wave signal S. In this manner, impulse waveform generating apparatus 400 can generate an impulse waveform that has characteristics close to those of the ideal waveform of FIG. 5C at higher precision than impulse waveform generating apparatus 100 of the first exemplary embodiment. In this exemplary embodiment, the fourth and fifth crest values are not reproduced.

With this structure, impulse waveform generating apparatus 400 of this exemplary embodiment generates delay pulse signals, using a parallel delay circuit formed of delay elements that are arranged in parallel and have incremented delay times by time T. In contrast, impulse waveform generating apparatus 100 of the first exemplary embodiment generates delay pulse signals, using a multistage delay circuit for generating delay pulse signals that is formed of delay elements each having delay time T arranged in a plurality of stages. Thus, impulse waveform generating apparatus 400 of this exemplary embodiment can change the accuracy required for the delay elements in impulse waveform generating apparatus 100 of the first exemplary embodiment, from delay time T to delay time difference T. Further, impulse waveforms can be generated by the circuit operation having a smaller delay time.

In impulse waveform generating apparatus 400 of this exemplary embodiment, the delay time of delay element 713 as the adjusting-delay element is set at τ2+T/2 so that the delay time of envelope formation signal R with respect to signal source signal Q is T/2. However, changing the delay time to a value according to the characteristics of the elements constituting the circuit, conditions for the manufacturing process and other factors can give the same advantages.

Fifth Exemplary Embodiment

Next, a description is provided of an impulse waveform generating apparatus in accordance with the fifth exemplary embodiment of the present invention. In impulse waveform generating apparatus 200 of the second exemplary embodiment, delay elements constituting the multistage delay pulse signal generating part are arranged in series, to generate delay pulse signals. In contrast, in the impulse waveform generating apparatus of this exemplary embodiment, delay elements having delay times incremented by time T are arranged in parallel, to generate delay pulse signals. This arrangement can change the accuracy required for the delay elements, from delay time T to delay time difference T. Thus, the delay time resulting from the operational delay in the circuit need not be considered when the circuit is designed.

The structure and operation of the impulse waveform generating apparatus of this embodiment are substantially the same as those of impulse waveform generating apparatus 200 of the second exemplary embodiment. Thus, the descriptions of the common elements and operations are omitted and only differences are described.

A description is provided of a structure of an impulse waveform generating apparatus of this exemplary embodiment.

Figure 19:
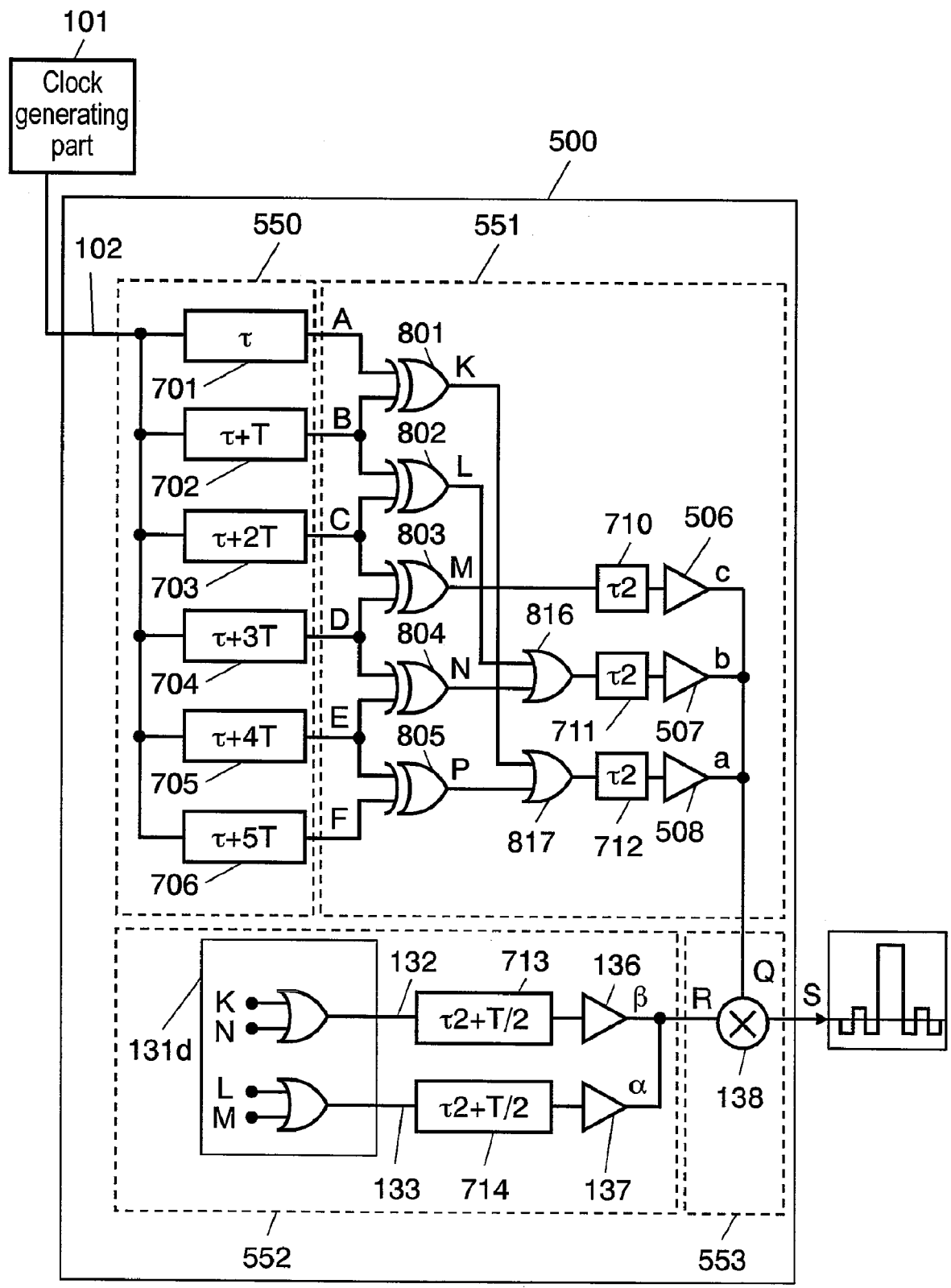
FIG. 19 is a block diagram of an impulse waveform generating apparatus in accordance with a fifth exemplary embodiment of the present invention.

FIG. 19 is a block diagram illustrating a structure of an impulse waveform generating apparatus in accordance with the fifth exemplary embodiment of the present invention. With reference to FIG. 19, impulse waveform generating apparatus 500 is different from impulse waveform generating apparatus 200 of the second exemplary embodiment shown in FIG. 10 in the following structure.

Instead of signal controller 103, and delay elements 106, 107, 108, 109 and 110 constituting the multistage delay circuit as the multistage delay part, multistage delay pulse signal generating part 550 includes delay elements 701, 702, 703, 704, 705, and 706 constituting a parallel delay circuit. Delay element 701 generates signal A by delaying timing signal 102 by time τ. Delay element 702 generates signal B by delaying timing signal 102 by time τ+T. Delay element 703 generates signal C by delaying timing signal 102 by time τ+2T. Delay element 704 generates signal D by delaying timing signal 102 by time τ+3T. Delay element 705 generates signal E by delaying timing signal 102 by time τ+4T. Delay element 706 generates signal F by delaying timing signal 102 by time τ+5T.

Signal source signal generating part 551 includes XOR elements 801, 802, 803, 804, and 805 for XORing signal A and signal B, signal B and signal C, signal C and signal D, signal D and signal E, and signal E and signal F to output signals K, L, M, N, and P, respectively. The signal source signal generating part also includes OR elements 816 and 817 for ORing signal L and signal N, and signal K and signal P, respectively, to output signals. The signal source signal generating part also includes delay element 710 for delaying signal M by time τ2 as a signal source delay element, delay element 711 for delaying the signal output from OR element 816 by time τ2 as a signal source delay element, and delay element 712 for delaying the signal output from OR element 817 by time τ2 as a signal source delay element.

Instead of waveform generator 131b, envelope formation signal generating part 552 includes waveform generator 131d for ORing signal K and signal N to output first control signal 132, and ORing signal L and signal M to output second control signal 133. Instead of delay elements 134 and 135 as the adjusting-delay elements, the envelope formation signal generating part includes delay element 713 and 714 for delaying first control signal 132 and second control signal 133, respectively, by time τ2+T/2, as other adjusting-delay elements.

In impulse waveform generating apparatus 500 of this exemplary embodiment, amplification factors c, b, a, β, and α of amplifiers 506, 507, 508, 136, and 137 are set at 1.000, −0.214, 0.151, −0.603, and 1.000, respectively.

A description is provided of the operation of impulse waveform generating apparatus 500 of this exemplary embodiment.

Impulse waveform generating apparatus 500 receives, from clock generating part 101, timing signal 102 that has time width Tau larger than 5T indicating a timing at which an impulse waveform is to be generated.

Then, in impulse waveform generating apparatus 500, delay elements 701, 702, 703, 704, 705, and 706 generate signal A delayed from timing signal 102 by time τ, signal B further delayed from signal A by time T, signal C further delayed from signal B by time T, signal D further delayed from signal C by time T, signal E further delayed from signal D by time T, and signal F further delayed from signal E by time T, respectively.

Next, in impulse waveform generating apparatus 500, XOR elements 801, 802, 803, 804, and 805 generate XOR signals K, L, M, N, and P, respectively, from signals A, B, C, D, E, and F. Amplifier 506 amplifies a signal obtained by delaying signal M by time τ2 at the prescribed magnification factor. Amplifier 507 amplifies a signal obtained by synthesizing signal L and signal N and delaying the synthesized signal by time τ2, at the prescribed magnification factor. Amplifier 508 amplifies a signal obtained by synthesizing signal K and signal P and delaying the synthesized signal by time τ2, at the prescribed magnification factor. Then, the output signals from amplifiers 506, 507, and 508 are synthesized to provide signal source signal Q.

Waveform generator 131d outputs first control signal 132 indicating time 0 through T and time 3T through 4T, and second control signal 133 indicating time T through 3T both from the timing at which the impulse waveform is to be generated. Further, delay element 713 delays first control signal 132 by time τ2+T/2. Delay element 714 delays second control signal 133 by time τ2+T/2. Amplifiers 136 and 137 amplify the signals output from delay elements 713 and 714 at the prescribed magnification factors. Then, the output signals from amplifiers 136 and 137 are synthesized to provide envelope formation signal R.

Finally, mixer 138 multiplies signal source signal Q by envelope formation signal R, to provide prescribed impulse waveform signal S.

Next, a description is provided of the respective signals in impulse waveform generating apparatus 500 of this exemplary embodiment.

Figure 20:
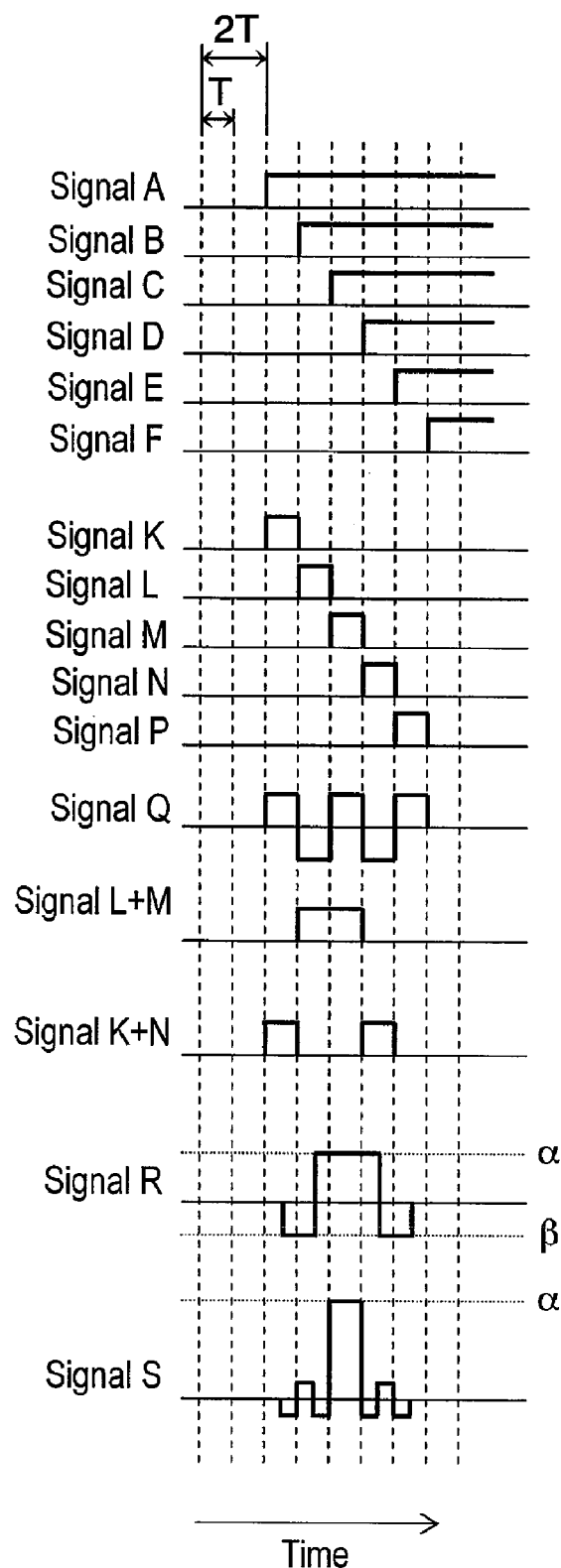
FIG. 20 is a timing diagram in the impulse waveform generating apparatus in accordance with the fifth exemplary embodiment.

FIG. 20 is a timing diagram in the impulse waveform generating apparatus in accordance with the fifth exemplary embodiment. In FIG. 20, signals A, B, C, D, E, and F are signals each having time width of at least 5T, and are sequentially generated with time difference T. Signals K, L, M, N, and P are signals each having time width T, and are generated with time difference T by XORing signal A and signal B, signal B and signal C, signal C and signal D, signal D and signal E, and signal E and signal F, respectively. Signal source signal Q is generated in the following manner. Delay element 710 delays signal M by time τ2 and amplifier 506 amplifies the delayed signal at the positive prescribed magnification factor. Delay element 711 delays the OR of signal L and signal N by time τ2 and amplifier 507 amplifies the delayed signal at the negative prescribed magnification factor. Delay element 712 delays the OR of signal K and signal P by time τ2 and amplifier 508 amplifies the delayed signal at the positive prescribed magnification factor. The respective output signals are synthesized to provide a signal waveform of which sign changes every time T.

First control signal 132 is generated by the OR of signal K and signal N. Second control signal 133 is generated by the OR of signal L and signal M. Envelope formation signal R is generated to delay by τ2+T/2 with respect to signal source signal Q. Delay elements 713 and 714 delay first control signal 132 and second control signal 133, respectively, by τ2+T/2. Then, amplifier 136 amplifies delayed first control signal 132 to a negative amplified value. Amplifier 137 amplifies delayed second control signal 133 to a positive amplified value. Thus, amplified values are synthesized into a waveform.

Impulse waveform signal S is generated as a signal waveform resulting from the synthesis of signal source signal Q and envelope formation signal R in mixer 138 by the same signal processing as impulse waveform generating apparatus 100 of the first exemplary embodiment.

Next, a description is provided of the characteristics of the impulse waveform signals generated in impulse waveform generating apparatus 500 of this exemplary embodiment.

FIG. 21 is a table showing crest values of an output signal from the impulse waveform generating apparatus in accordance with the fifth exemplary embodiment of the present invention. In FIG. 21, the true values are the first through fifth crest values in FIG. 5C, and the instances are the crest values of impulse waveform signal S obtained by the above amplification factor settings. The first through fourth crest values of the impulse waveform generated by impulse waveform generating apparatus 500 can be calculated by calculation formulas "αc", "αb", "βb", and "βa", respectively. These values are 1.000 (561), −0.214 (562), 0.129 (563), and −0.091 (564) and can be made correspond with the true values of the first through fourth crest values of impulse wave signal S. In this manner, like impulse waveform generating apparatus 200 of the second exemplary embodiment, impulse waveform generating apparatus 500 can generate an impulse waveform that has characteristics close to those of the ideal waveform of FIG. 5C, at higher precision than impulse waveform generating apparatus 100 of the first exemplary embodiment. In this exemplary embodiment, the fifth crest value is not reproduced.

With this structure, impulse waveform generating apparatus 500 of this exemplary embodiment generates delay pulse signals in a parallel delay circuit that includes delay elements for incrementing the delay times by time T arranged in parallel. In contrast, impulse waveform generating apparatus 100 of the first exemplary embodiment generate delay pulse signals in a multistage delay circuit that includes delay elements each having delay time T arranged in a plurality of stages. Thus, impulse waveform generating apparatus 500 of this exemplary embodiment can change the accuracy required for the delay elements in impulse waveform generating apparatus 100 of the first exemplary embodiment, from delay time T to delay time difference T. Further, the delay time resulting from the operational delay in the circuit need not be considered when the circuit is designed.

In impulse waveform generating apparatus 500 of this exemplary embodiment, the delay time of delay elements 713 and 714 as the other adjusting-delay elements is set at τ2+T/2 so that the delay time of envelope formation signal R with respect to signal source signal Q is T/2. However, changing the delay time to a value according to the characteristics of the elements constituting the circuit, conditions for the manufacturing process and other factors can give the same advantages.

Sixth Exemplary Embodiment

Next, a description is provided of an impulse waveform generating apparatus in accordance with the sixth exemplary embodiment of the present invention. The impulse waveform generating apparatus of the fifth exemplary embodiment is structured so that delay signals are processed using XOR elements. In contrast, the impulse waveform generating apparatus of this exemplary embodiment is structured so that the combination of AND elements and inverting elements process the delay signals to reduce the delay time of a timing at which impulses are to be generated.

The structure and operation of the impulse waveform generating apparatus of this embodiment are substantially the same as those of impulse waveform generating apparatus 500 of the fifth exemplary embodiment. Thus, the descriptions of the common elements and operations are omitted and only differences are described.

A description is provided of a structure of an impulse waveform generating apparatus of this embodiment.

Figure 22:
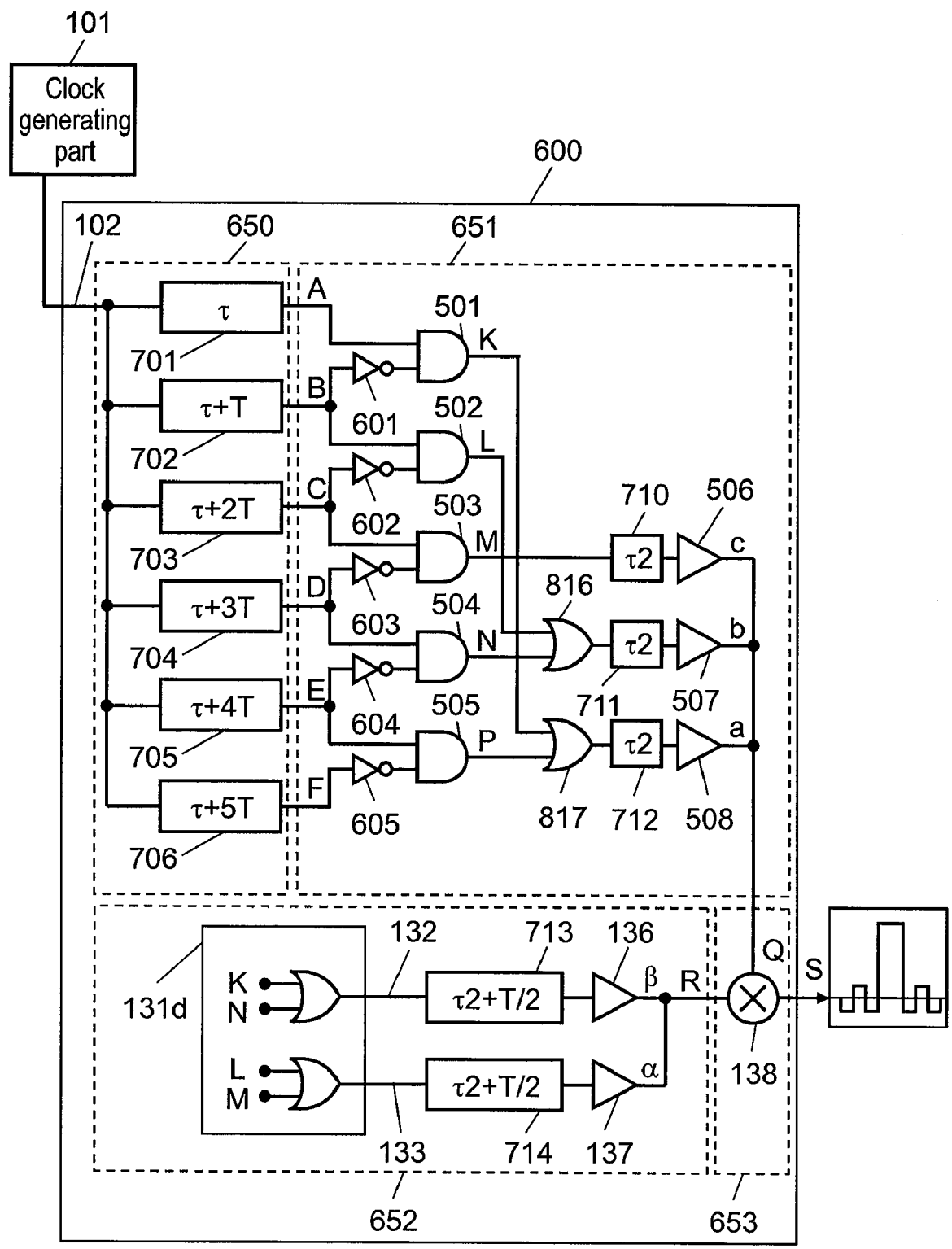
FIG. 22 is a block diagram of an impulse waveform generating apparatus in accordance with a sixth exemplary embodiment of the present invention.

FIG. 22 is a block diagram illustrating an impulse waveform generating apparatus in accordance with the sixth exemplary embodiment of the present invention. With reference to FIG. 22, impulse waveform generating apparatus 600 is different from impulse waveform generating apparatus 500 of the fifth exemplary embodiment shown in FIG. 19 in the following structure. Instead of XOR elements 801, 802, 803, 804, and 805, AND elements 501, 502, 503, 504, and 505 are provided. Provided as the input into these AND elements are inverting elements 601, 602, 603, 604, and 605 for inverting signals B, C, D, E, and F, respectively.

In impulse waveform generating apparatus 600 of this exemplary embodiment, like impulse waveform generating apparatus 500 of the fifth exemplary embodiment, amplification factors c, b, a, β, and α of amplifiers 506, 507, 508, 136, and 137 are set at 1.000, −0.214, 0.151, −0.603, and 1.000, respectively.

A description is provided of the operation of impulse waveform generating apparatus 600 of this exemplary embodiment.

In impulse waveform generating apparatus 600, delay elements 701, 702, 703, 704, 705, and 706 constituting a parallel delay circuit delay timing signal 102 that is generated by clock generating part 101 and has time width Tau larger than 5T. Then, inverting elements 601, 602, 603, 604, and 605 generate inverted signals of signals B, C, D, E, and F, respectively. Further, AND element 501 generates signal K resulting from the AND operation of signal A and the inverted signal of signal B. AND element 502 generates signal L resulting from the AND operation of signal B and the inverted signal of signal C. AND element 503 generates signal M resulting from the AND operation of signal C and the inverted signal of signal D. AND element 504 generates signal N resulting from the AND operation of signal D and the inverted signal of signal E. AND element 505 generates signal P resulting from the AND operation of signal E and the inverted signal of signal F. Thereafter, by the same signal processing as the fifth exemplary embodiment, signal source signal Q, envelope formation signal R, and prescribed impulse signal S are generated.

Next, a description is provided of the respective signals in impulse waveform generating apparatus 600 of this exemplary embodiment.

Figure 23:
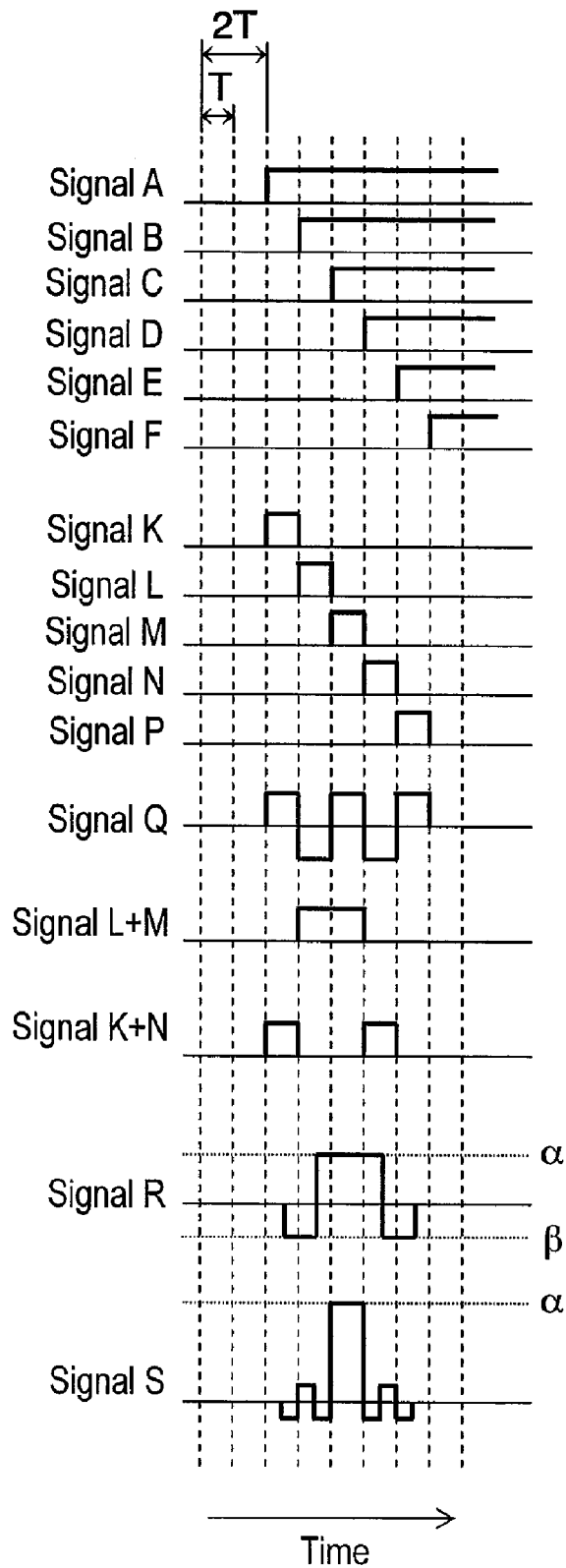
FIG. 23 is a timing diagram in the impulse waveform generating apparatus in accordance with the sixth exemplary embodiment.

FIG. 23 is a timing diagram in the impulse waveform generating apparatus in accordance with the sixth exemplary embodiment. The signal waveforms in FIG. 23 have substantially the same shapes as the signal waveforms generated in impulse waveform generating apparatus 500 of the fifth exemplary embodiment shown in FIG. 20.

Next, a description is provided of the characteristics of the impulse waveform signals generated in impulse waveform generating apparatus 600 of this exemplary embodiment.

Figure 24:
FIG. 24 is a table showing crest values of an output signal from the impulse waveform generating apparatus in accordance with the sixth exemplary embodiment.
Figure 25:
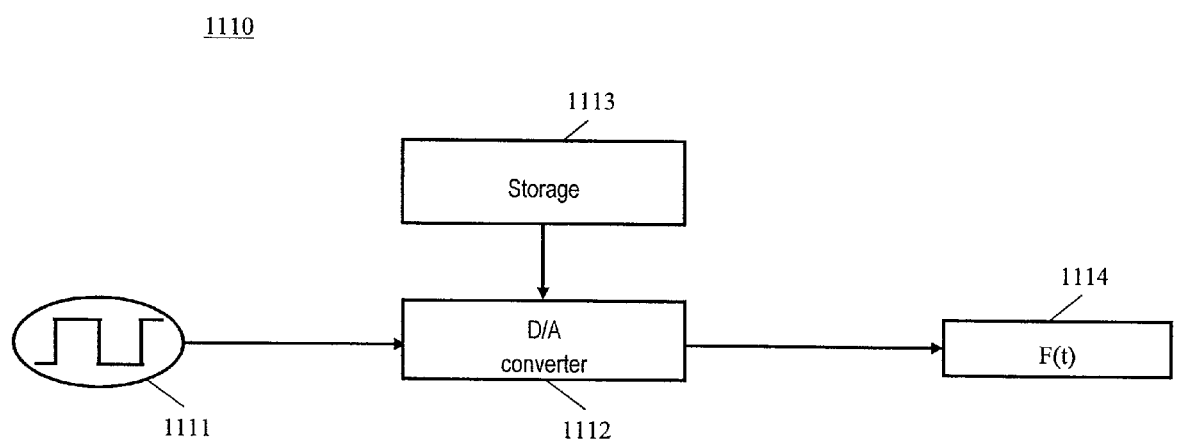
FIG. 25 is a block diagram of a conventional impulse waveform generating apparatus using a digital-to-analog converter.
Figure 26:
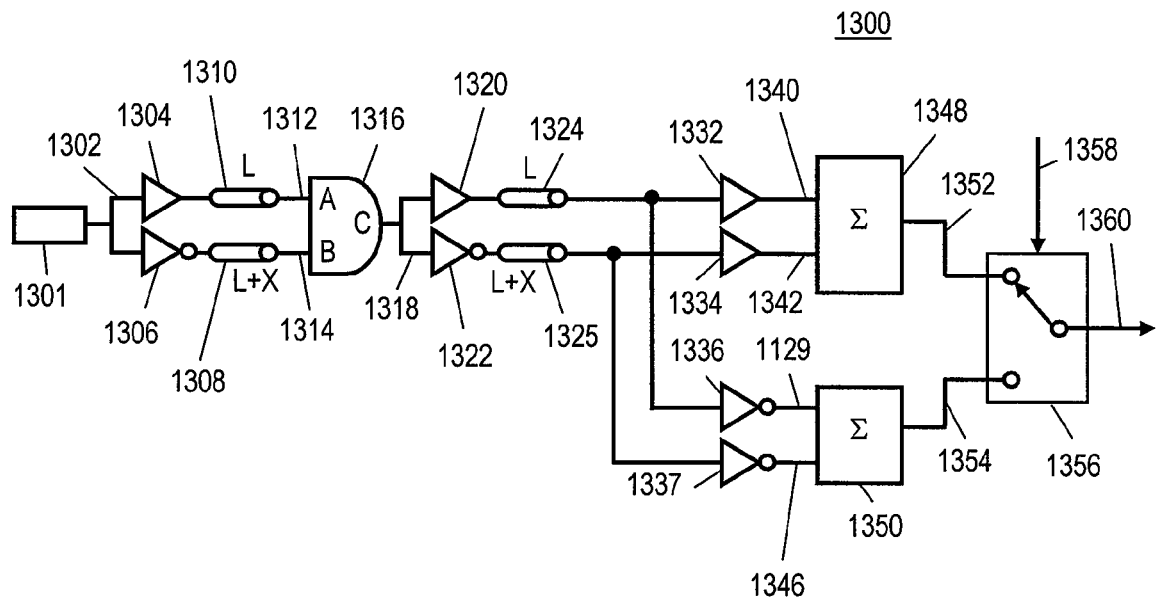
FIG. 26 is a block diagram of a conventional impulse waveform generating apparatus using a digital circuit.
Figure 27:
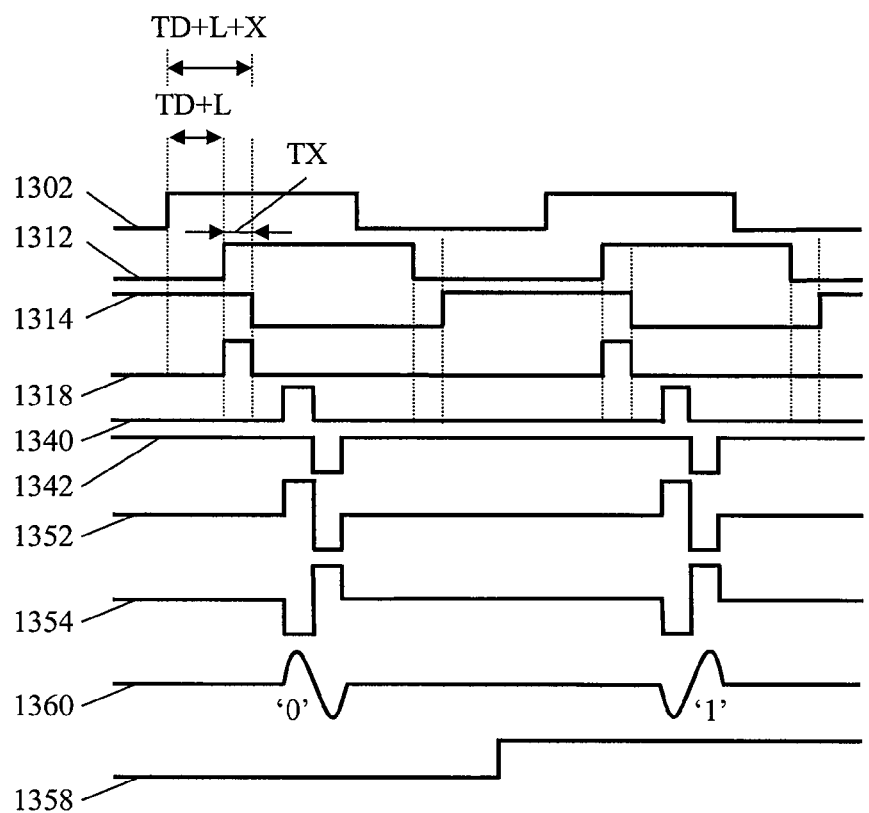
FIG. 27 is a timing diagram in the conventional impulse waveform generating apparatus using a digital circuit.

FIG. 24 is a table showing crest values of an output signal from the impulse waveform generating apparatus in accordance with the sixth exemplary embodiment of the present invention. The first through fourth crest values of the impulse waveform generated by impulse waveform generating apparatus 600 can be calculated by calculation formulas "$\alpha c$", "$\alpha b$", "$\beta b$", and "$\beta a$", respectively. These values are 1.000 (661), −0.214 (662), 0.129 (663), and −0.091 (664), and can be made correspond with the true values of the first through fourth crest values of impulse waveform signal S. In this manner, like impulse waveform generating apparatus 500 of the fifth exemplary embodiment, impulse waveform generating apparatus 600 can generate an impulse waveform that has characteristics close to those of the ideal waveform of FIG. 5C, at higher precision than impulse waveform generating apparatus 100 of the first exemplary embodiment.

With this structure, in impulse waveform generating apparatus 600 of this exemplary embodiment, the combination of AND elements and inverting elements process the delay signals. Thus, impulse waveform generating apparatus 600 can make the timings at which signals K, L, M, and N are generated time T earlier than those of impulse waveform generating apparatus 500 of the fifth exemplary embodiment, thus reducing the delay time of the timing at which impulses are to be generated.

In impulse waveform generating apparatus 600 of this exemplary embodiment, the delay time of delay elements 713 and 714 as the other adjusting-delay elements is set at $\tau 2+T/2$ so that the delay time of envelope formation signal R with respect to signal source signal Q is T/2. However, changing the delay time to a value according to the characteristics of the elements constituting the circuit, conditions for the manufacturing process and other factors can give the same advantages.

INDUSTRIAL APPLICABILITY

An impulse waveform generating apparatus and radio-frequency pulse waveform generating apparatus of the present invention can reduce the operational frequency of each element thereof. For this reason, such apparatus is useful for wireless telecommunication equipment using the impulse communication scheme, such as UWB wireless equipment.

The invention claimed is:

1. An impulse waveform generating apparatus for generating an impulse waveform signal from a timing signal indicating a timing at which an impulse is to be generated, the apparatus comprising:

a multistage delay pulse signal generating part for generating a plurality of delay pulse signals having different delay times from the timing signal;

a signal source signal generating part for generating a signal source signal indicating a frequency component of the impulse waveform signal by the delay pulse signals;

an envelope formation signal generating part for generating an envelope formation signal indicating an amplitude component of the impulse waveform signal by the delay pulse signals; and a mixer part for multiplying the signal source signal by the envelope formation signal to generate the impulse waveform signal.

2. The impulse waveform generating apparatus of claim 1, wherein the multistage delay pulse signal generating part includes:

a signal controller for receiving the timing signal and generating a reference time signal having a prescribed pulse width in response to a control signal; and a multistage delay part for generating the plurality of delay pulse signals from the reference time signal and feeding one of the plurality of delay pulse signals into the signal controller, as the control signal.

3. The impulse waveform generating apparatus of claim 2, wherein the multistage delay part includes a multistage delay circuit that has a plurality of delay elements coupled in a plurality of stages, and each of the delay elements has a first delay time;

wherein the reference time signal is fed into the multistage delay circuit and the plurality of the delay pulse signals having different delay times are respectively output from between corresponding ones of the stages of the multistage delay circuit.

4. The impulse waveform generating apparatus of claim 3, wherein the envelope formation signal generating part includes:

a plurality of adjusting-delay elements and a plurality of amplifiers, wherein each of the adjusting-delay elements has a delay time of a half the first delay time of each of the delay elements constituting the multistage delay part, and each of the amplifiers has a prescribed amplification factor, the respective adjusting-delay elements delay a plurality of signals generated by a waveform generator;

the amplifiers amplify the delayed plurality of signals based on the prescribed amplification factors; and the amplified signals are synthesized to generate the envelope formation signal.

5. The impulse waveform generating apparatus of claim 4, wherein, when each of the amplifiers has a positive amplification factor, each of the amplifiers outputs a respective signal by amplifying the delayed plurality of signals at a value of the amplification factor; and when each of the amplifiers has a negative amplification factor, each of the amplifiers outputs a respective signal by amplifying the delayed plurality of signals at an absolute value of the amplification factor and inverting a phase of the amplified signal.

6. The impulse waveform generating apparatus of claim 1, wherein the signal source signal generating part includes a plurality of amplifiers, and each of the amplifiers has a prescribed amplification factor;

the plurality of amplifiers amplify respectively a plurality of signals generated by the delay pulse signals based on the corresponding prescribed amplification factors; and the respective amplified signals are synthesized to provide the signal source signal.

7. The impulse waveform generating apparatus of claim 6, wherein, when each of the amplifiers has a positive amplification factor, each of the amplifiers outputs a signal by amplifying respectively the plurality of signals at a value of the amplification factor; and when each of the amplifiers has a negative amplification factor, each of the amplifiers outputs a signal by amplifying the input signal at an absolute value of the amplification factor and inverting a phase of the amplified signal.

8. The impulse waveform generating apparatus of claim 1, wherein, the multistage delay pulse signal generating part includes a parallel delay circuit formed of a plurality of delay elements coupled in parallel with each other, and each one of the delay elements has a delay time which differs from another one of the delay elements by a first delay time; and the timing signal is fed into the parallel delay circuit, and the plurality of delay pulse signals with their respective delay times are delayed output signals which are output from the respective delay elements in the parallel delay circuit.

9. The impulse waveform generating apparatus of claim 8, wherein, the envelope formation signal generating part includes:

an adjusting-delay element having a delay time which is the addition of a further second delay time and a half of the first delay time; and a plurality of amplifiers, and each of the amplifiers has a prescribed amplification factor;

the adjusting-delay element further delays the delayed output signals which have been XORed to generate further delayed signals;

the amplifiers amplify the further delayed signals which have been further delayed by the adjusting-delay element at the corresponding prescribed amplification factors; and the plurality of amplified signals are synthesized to generate the envelope formation signal.

10. The impulse waveform generating apparatus of claim 9, wherein, when each of the amplifiers has a positive amplification factor, each of the amplifiers outputs a respective signal by amplifying the further delayed signals at a value of the amplification factor; and when each of the amplifiers has a negative amplification factor, each of the amplifiers outputs a respective signal by amplifying the further delayed signals at an absolute value of the amplification factor and inverting a phase of the amplified signal.

11. The impulse waveform generating apparatus of claim 1, wherein, the signal source signal generating part includes:

a plurality of signal source delay elements, each of the signal source delay elements having a second delay time; and a plurality of amplifiers, and each of the amplifiers has a prescribed amplification factor;

the signal source delay elements delay a plurality of signals generated by the delay pulse signals;

the amplifiers amplify the delayed signals based on the corresponding prescribed amplification factors; and the respective amplified signals are synthesized to generate the signal source signal.

12. The impulse waveform generating apparatus of claim 11, wherein, when each of the amplifiers has a positive amplification factor, each of the amplifiers outputs a respective signal by amplifying the delayed signals at a value of the amplification factor; and when each of the amplifiers has a negative amplification factor, each of the amplifiers outputs a respective signal by amplifying the delayed signals at an absolute value of the amplification factor and inverting a phase of the amplified signal.

13. The impulse waveform generating apparatus of claim 1, further comprising:

a synthesizing signal generator for generating a synthesizing signal indicating one of a frequency component and an amplitude component of the impulse waveform signal from the delay pulse signals; and an additional mixer part for multiplying the impulse waveform signal by the synthesizing signal, to generate another impulse waveform signal.

14. A radio-frequency (RF) pulse waveform generating apparatus comprising:

an impulse waveform generating apparatus for generating an impulse waveform signal from a timing signal indicating a timing in which an impulse is to be generated, the apparatus including:

a multistage delay pulse signal generating part for generating, a plurality of delay pulse signals having different delay times from the timing signal;

a signal source signal generating part for generating, a signal source signal indicating a frequency component of the impulse waveform signal by the delay pulse signals;

an envelope formation signal generating part for generating, an envelope formation signal indicating an amplitude component of the impulse waveform signal by the delay pulse signals; and a mixer part for multiplying the signal source signal by the envelope formation signal to generate the impulse waveform signal; and a RF pulse waveform signal generating part for receiving the impulse waveform signal generated by the impulse waveform generating apparatus, and generating a RF pulse waveform signal.

15. The RF pulse waveform generating apparatus of claim 14, wherein the RF pulse waveform generating part controls at least one of an output spectrum from an oscillating circuit and an output waveform, in response to the impulse waveform signal fed into the RF pulse waveform signal generating part, and generates a RF pulse waveform signal having a different waveform.

16. The RF pulse waveform generating apparatus of claim 14, wherein the RF pulse waveform generating part further performs waveform modulation on the RF pulse waveform signal, in response to a transmit data signal.

* * * * *